(12) United States Patent
Hashim

(10) Patent No.: US 9,305,791 B2
(45) Date of Patent: Apr. 5, 2016

(54) HIGH PRODUCTIVITY COMBINATORIAL WORKFLOW TO SCREEN AND DESIGN CHALCOGENIDE MATERIALS AS NON VOLATILE MEMORY CURRENT SELECTOR

(71) Applicant: Intermolecular, Inc., San Jose, CA (US)

(72) Inventor: Imran Hashim, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 216 days.

(21) Appl. No.: 14/135,505

(22) Filed: Dec. 19, 2013

(65) Prior Publication Data

US 2014/0273314 A1 Sep. 18, 2014

Related U.S. Application Data

(60) Provisional application No. 61/780,128, filed on Mar. 13, 2013.

(51) Int. Cl.
*H01L 21/8234* (2006.01)
*H01L 21/30* (2006.01)
(Continued)

(52) U.S. Cl.
CPC ............ *H01L 21/30* (2013.01); *B01J 19/0046* (2013.01); *B08B 3/04* (2013.01); *C23C 14/08* (2013.01); *C23C 14/22* (2013.01); *C23C 14/34* (2013.01); *C23C 18/1619* (2013.01); *C23C 18/1682* (2013.01); *C25D 17/02* (2013.01); *G11C 13/0004* (2013.01); *H01L 21/02104* (2013.01); *H01L 21/30604* (2013.01); *H01L 21/6719* (2013.01); *H01L 21/67051* (2013.01); *H01L 21/67057* (2013.01); *H01L 22/10* (2013.01); *H01L 22/12* (2013.01); *H01L 22/14* (2013.01); *H01L 27/2463* (2013.01); *H01L 45/1608* (2013.01); *B01J 2219/0038* (2013.01); *B01J 2219/00283* (2013.01); *B01J 2219/00286* (2013.01); *B01J 2219/00301* (2013.01); *B01J 2219/00313* (2013.01); *B01J 2219/00382* (2013.01); *B01J 2219/00416* (2013.01); *B01J 2219/00418* (2013.01); *B01J 2219/00527* (2013.01); *B01J 2219/00585* (2013.01)

(58) Field of Classification Search
CPC ............ G11C 13/0004; H01L 27/2436; H01L 27/2463; H01L 27/2472; H01L 27/2481; H01L 27/249
USPC .................................. 438/238, 382, 384, 385
See application file for complete search history.

(56) References Cited

U.S. PATENT DOCUMENTS

| 8,148,707 B2 | 4/2012 | Ovshinsky et al. | |
| 2009/0302303 A1* | 12/2009 | Lowrey | G11C 5/02 257/5 |
| 2014/0169062 A1* | 6/2014 | Lee | G11C 13/0002 365/148 |

OTHER PUBLICATIONS

Kau et al.; A Stackable Cross Point Phase Change Memory; 2009; IEEE; pp. 27.1.1-27.1.4.

(Continued)

*Primary Examiner* — Kevin M Picardat

(57) ABSTRACT

Combinatorial workflow is provided for evaluating materials and processes for current selector devices in a cross point memory array. Blanket layers, metal-insulator-metal devices, and compete memory structures are combinatorially fabricated on multiple regions of a substrate, with each region having a different material and process condition for the current selector devices. The current selector devices are then characterized, and the data are compared to obtain the optimum materials and processes.

18 Claims, 19 Drawing Sheets

(51) Int. Cl.
*B08B 3/04* (2006.01)
*G11C 13/00* (2006.01)
*H01L 27/24* (2006.01)
*C23C 14/08* (2006.01)
*C23C 14/22* (2006.01)
*C23C 14/34* (2006.01)
*H01L 21/02* (2006.01)
*H01L 21/66* (2006.01)
*H01L 45/00* (2006.01)
*H01L 21/306* (2006.01)
*H01L 21/67* (2006.01)
*C23C 18/16* (2006.01)
*C25D 17/02* (2006.01)
*B01J 19/00* (2006.01)

(56) References Cited

OTHER PUBLICATIONS

Czubatyj et al.; Invited Paper: Thin-Film Ovonic Threshold Switch: Its Operation and Application in Modern Integrated Circuits; 2012; Electronic Materials Letters, vol. 8, No. 2; pp. 157-167.

Burr et al.; Large-scale (512kbit) integration of Multilayer-ready Access-Devices based on Mixed-Ionic-Electronic-Conduction (MIEC) at 100% yield; 2012; Symposium on VLSI Technology Digest of Technical Papers; IEEE; pp. 41-42.

Riess; Mixed ionic—electronic conductors—material properties and applications; 2003; Solid State Ionics; Elsevier Science B.V.; pp. 1-17.

\* cited by examiner

Forming a first layer over a substrate,
wherein the first layer comprises a chalcogenide
material, wherein the first layer is operable as an
ovonic threshold switch
or
wherein the first layer comprises a mixed ionic
electronic material, wherein the first layer is
operable as an non linear I-V device
1400

Forming a first electrode over the first layer,
wherein the first layer is formed using combinatorial
processing
1410

FIG. 14

HIGH PRODUCTIVITY COMBINATORIAL WORKFLOW TO SCREEN AND DESIGN CHALCOGENIDE MATERIALS AS NON VOLATILE MEMORY CURRENT SELECTOR

This application claims priority to U.S. Provisional Patent Application No. 61/780,128 entitled "HPC methods for processing materials" filed on Mar. 13, 2013, which is incorporated herein by reference.

FIELD OF THE INVENTION

The present invention relates generally to combinatorial methods for device process development. More specifically, combinatorial methods of developing materials and fabrication processes for current selectors using chalcogenide materials in non volatile memory devices.

BACKGROUND OF THE INVENTION

Advances in semiconductor device usages have demanded ever-increasing high functional density with continuous size scaling for memory devices. This scaling process has led to the consideration of various architectures and materials in memory arrays.

The introduction of new materials to the memory device, e.g., in the formation of the memory elements and their support components, can require evaluations of different materials and compositions, together with imposing significant changes to the device fabrication process, including device structure designs to reduce leakage, thermal processing to achieve thermal stability and phase stability, and device integration process to achieve memory array performance, together with endurance, variability, and reliability.

The manufacture of novel memory architectures and materials entails the integration and sequencing of many unit processing steps, with potential new process developments, since in general, new materials are much more sensitive to process conditions than existing materials. For example, the precise sequencing and integration of the unit processing steps can enable the formation of functional devices meeting desired performance metrics such as power efficiency, signal propagation, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

High productivity combinatorial (HPC) processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD). However, HPC processing techniques have not been successfully adapted to the development of current selector for non volatile memory devices in cross point memory arrays.

Therefore, there is a need to apply high productivity combinatorial techniques to the development and investigation of materials and fabrication processes for the manufacture of current selectors in non volatile memory arrays.

SUMMARY OF THE DESCRIPTION

In some embodiments, the present invention discloses combinatorial workflow for evaluating and developing materials and processes for current selectors in a cross point memory array. In a primary screening step, blanket films of current selector materials are combinatorially deposited on multiple regions of a substrate, with each region receiving a different material composition or a different deposition or treatment process. The blanket films are then characterized and the data are compared to categorize the properties of different materials and processes. For example, for ovonic threshold switching (OTS) devices, the characterized data can include deposition rate, composition, microstructure, thermal stability, amorphous phase stability, breakdown voltage, and leakage current. For mixed ionic electronic conduction (MIEC) devices, the characterized data can include deposition rate, composition, microstructure, density, and ionic and electronic conductivities (which can be measured by impedance spectroscopy). Optimized materials and processes can be obtained to screen out unsuitable selections.

In a secondary screening, overlap capacitor structures are combinatorially fabricated on multiple regions of a substrate, with each region receiving a different optimized material and process. The capacitor structures are then characterized, and the data are compared to categorize the properties of different materials and processes. For example, threshold switching (for OTS devices) or device characterization (for MIEC devices) using alternate current (AC) testing, endurance, variability, and reliability are measured, together with understanding the switching mechanism. Optimized chemicals and processes can be obtained to screen out unsuitable selections.

In a tertiary screening, device structures are combinatorially fabricated on multiple regions of a substrate, with each region receiving a different optimized material and process. The device structures are then characterized, e.g., integration of the current selectors with the memory array performance, and the data are compared to categorize the properties of different materials and processes. Optimized chemicals and processes can be identified to obtain desired materials and processes.

In some embodiments, the combinatorial workflow includes evaluating different materials, compositions and fabrication processes, different heat treatments for current selector layer, different processes and sequences of an integration of the current selectors to the cross point array fabrication.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 14 illustrates a flowchart for a combinatorial processing of materials for current selectors according to some embodiments.

DETAILED DESCRIPTION

Figure 1:
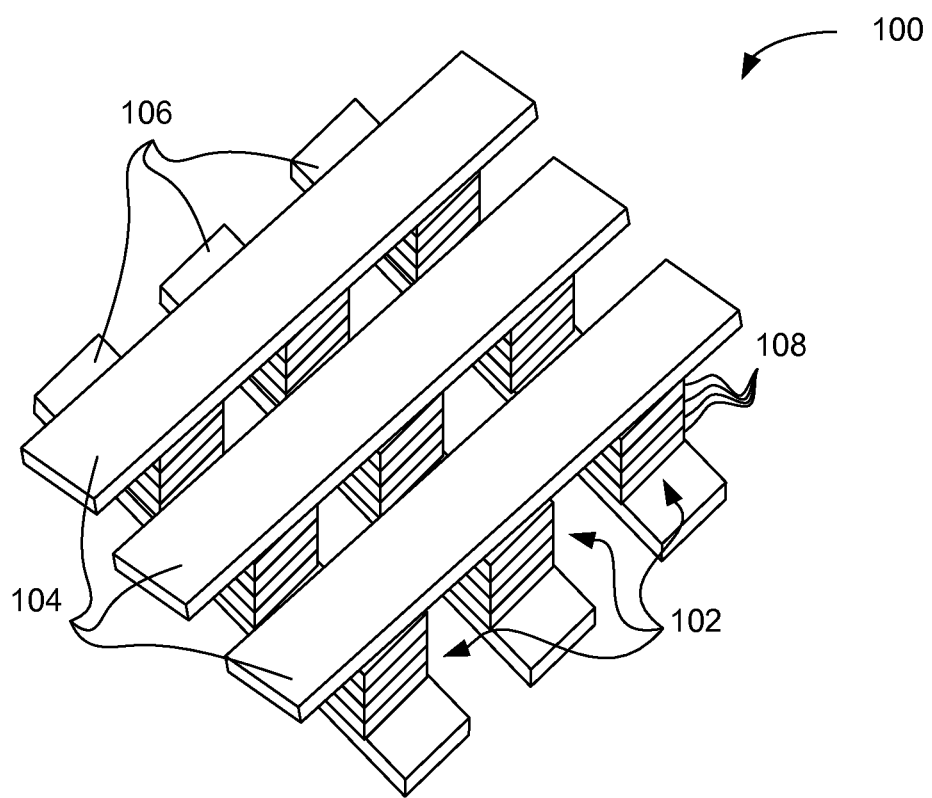
FIG. 1 illustrates a memory array of resistive switching memory elements according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, methods are provided, and memory arrays fabricated from the methods, to fabricate current selectors which can be used in a non volatile memory device. The non volatile memory device can include memory structures that can be used in a cross point memory array architecture, such as a phase change memory device or a resistive switching memory device. The current selectors can include a chalcogenide material, which is operable as an ovonic threshold switching (OTS) device for reducing leakage currents from a cross point memory array architecture. The current selectors can include a mixed ionic electronic conduction (MIEC) material, which is operable as a non-linear I-V device with low leakage current at low voltages and high current density at high voltages.

In some embodiments, provided is a method to screen OTS and/or MIEC materials as NVM current selector, using very high throughput primary, secondary, and tertiary screening HPC workflows, where the critical parameters for these materials/devices can be obtained in a comprehensive and efficient manner.

In some embodiments, provided are methods for extracting critical materials and device properties of OTS and/or MIEC current selectors, using fast and efficient HPC workflows, which can be used to quickly optimize OTS and/or MIEC materials, together with electrode material composition or stacks for best device performance.

A cross-bar architecture is promising for future non-volatile memories such as phase change memory (PCM) or resistive random access memory (ReRAM) because of the small cell size of $4F^2$, with F being a minimum feature size. A $4F^2$ architecture is defined as having a memory cell at each crossing of wordline and bitline, with the cell being 2F×2F. Thus in a cross point array, the small cell size of $4F^2$ can be achievable with each cell at an intersection of perpendicular wordlines and bitlines, and the potential to stack multiple layers to achieve very high memory density. Two key challenges for the cross bar architecture are the possibility of current sneak-through paths (e.g., when trying to read a cell in high resistance state adjacent to cells in low resistance state) and the need to avoid unselected cell modification when half of the switching voltage is applied to the selected cell.

FIG. 1 illustrates a memory array of resistive switching memory elements according to some embodiments. The memory elements can function as the storage elements of the memory array, which is configured in a cross point configuration. The cross point memory array can include horizontal word lines that cross vertical bit lines, with the memory elements located at the cross points of the word lines and the bit lines.

Memory array 100 may be part of a memory device or other integrated circuit. Memory array 100 is an example of potential memory configurations; it is understood that several other configurations are possible.

Read and write circuitry may be connected to memory elements 102 using signal lines 104 and orthogonal signal lines 106. Signal lines such as signal lines 104 and signal lines 106 are sometimes referred to as word lines and bit lines and are used to read and write data into the elements 102 of array 100. Individual memory elements 102 or groups of memory elements 102 can be addressed using appropriate sets of signal lines 104 and 106. Memory element 102 may be formed from one or more layers 108 of materials, as is described in further detail below. In addition, the memory arrays shown can be stacked in a vertical fashion to make multi-layer 3-D memory arrays.

Any suitable read and write circuitry and array layout scheme may be used to construct a non-volatile memory device from resistive switching memory elements such as element 102. For example, horizontal and vertical lines 104 and 106 may be connected directly to the terminals of resistive switching memory elements 102. This is merely illustrative.

During the operation of the cross point memory array, such as a read operation, the state of a memory element 102 can be sensed by applying a sensing voltage (i.e., a "read" voltage) to an appropriate set of signal lines 104 and 106. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e., a "1" bit). If, on the other hand, the memory element has a high resistance, the memory element may be said to contain a logic zero (i.e., a "0" bit). During a write operation, the state of a memory element can be changed by application of suitable write signals to an appropriate set of signal lines 104 and 106.

Ideally, only the selected memory cell, e.g., during a read operation, can experience a current. However, currents, often referred as sneak path currents, can flow through unselected memory elements during the read operation. The sensing of the resistance state of a single memory call can be unreliable. For example, all memory cells in the array are coupled together through many parallel paths.

Figure 2:
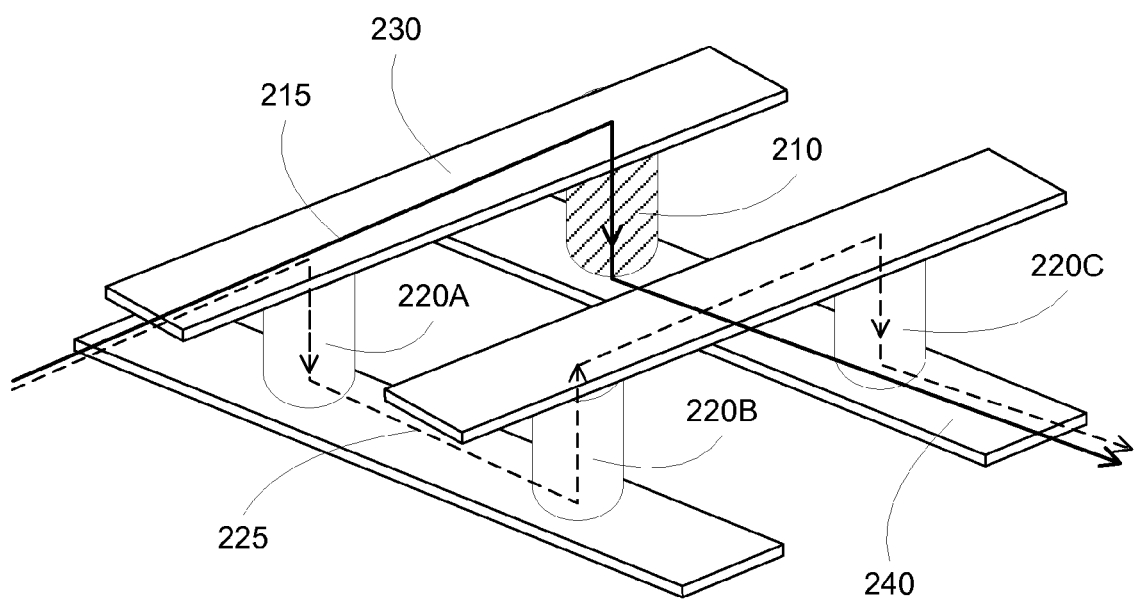
FIG. 2 illustrates sneak path currents in a cross point memory array according to some embodiments.

FIG. 2 illustrates sneak path currents in a cross point memory array according to some embodiments. A memory cell 210 can be selected, for example, for a read operation, by applying a voltage to signal line 230, and grounding signal line 240. A sensing current 215 can flow through the memory cell 210. However, parallel current paths, e.g., sneak path current, can exist, for example, represented by a series of memory cells 220A, 220B, and 220C, depending on the state of these cells. The applied voltage (signal line 230) can generate a current 225 through memory cells 220A-220C, and returning to the ground (signal line 240). The sneak path current 225 can be particularly large, e.g., larger than the sensing current 215, when the selected cell 210 is at high resistance state and the neighbor cells 220A-220C are at low resistance state.

There can be multiple sneak path currents 225, and the resistances of the series memory cells 220A-220C can be smaller than that of the selected memory cell 210, thus can obscure the sense current 215 through the selected memory cell 210 during a read operation.

To reduce or eliminate the sneak path occurrence, a control device, e.g., a selector, can be used in the cross point memory array. For example, a diode can be located in each memory cell. The control device can isolate the selected memory cell from unselected memory cells due to rectifying behavior of the diode, i.e. no current flow through the device unless $V_{applied}$ is greater than $V_{threshold}$.

The sneak path current 225 can include currents in opposite direction as compared to the sensing current. For example, as seen in FIG. 2, sneak path current 225 passes through memory device 220B at an opposite direction, e.g., upward, as compared to the sensing current 215 passing through the selected memory cell 210. Thus a one-way electrical device, such as a diode, can be used to block the sneak current path 225. For example, a diode can be added to each memory device, e.g., memory devices 210, and 220A-220C, thus allowing currents to pass only in one direction. As an example, the diodes can be incorporated to the memory devices so that the current can only pass in a downward direction in FIG. 2 for voltages above a threshold voltage. With the incorporation of diodes, the sneak path current can be blocked, for example, at memory device 220B.

In some embodiments, methods and systems for lower current values through a memory element, for example, during a read operation or a set or reset operation, are provided. The current for the memory element can be significantly reduced at lower than the switching voltages, such as a read voltage, while still maintaining appropriate current at the switching voltages to avoid interfering with the memory device operations. In some embodiments, the current density can be small, e.g., <$10^3$ A/cm$^2$, at half of the switching voltage ($V_s/2$) to prevent modification to the memory array. The low current at half the switching voltage can ensure that when $V_s/2$ is applied to selected cell, e.g., $V_s/2$ is applied to selected row and $-V_s/2$ is applied to selected column, the other cells on the selected row and column are not accidentally programmed or disturbed. The current selector thus should have high resistance at $V_s/2$. In some embodiments, the current density can be large, e.g., ~$10^6$-$10^7$ A/cm$^2$, at the switching voltage, e.g., set or reset voltage to allow switching of the memory cells. In other words, the current selector can have very low resistance at $V_s$ to ensure that the voltage drop across the current selector can be minimal during the memory cell programming.

In some embodiments, current selectors or current steering devices are provided with a non-linear current-voltage (I-V) behavior, including low current at low voltages and high current at higher voltages. At low voltages, e.g., lower than the switching voltages or at half an switching voltage, the current can be significantly reduced, while the current can remain the same or can be controlled to ensure proper operation of the memory devices. The lower current values at low voltages can also reduce power consumption and thus improve the power efficiency of the memory arrays.

Figure 3A:
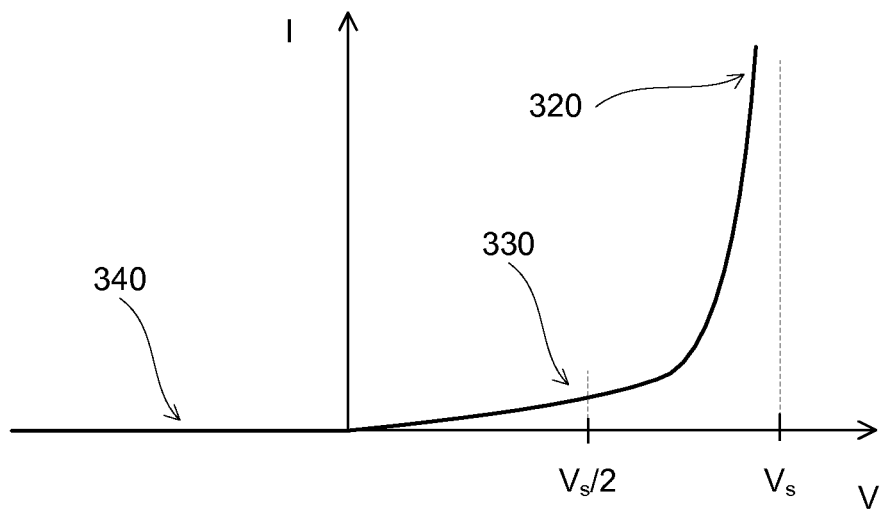
FIGS. 3A-3B illustrate examples of I-V response for a selector device according to some embodiments.
Figure 3B:
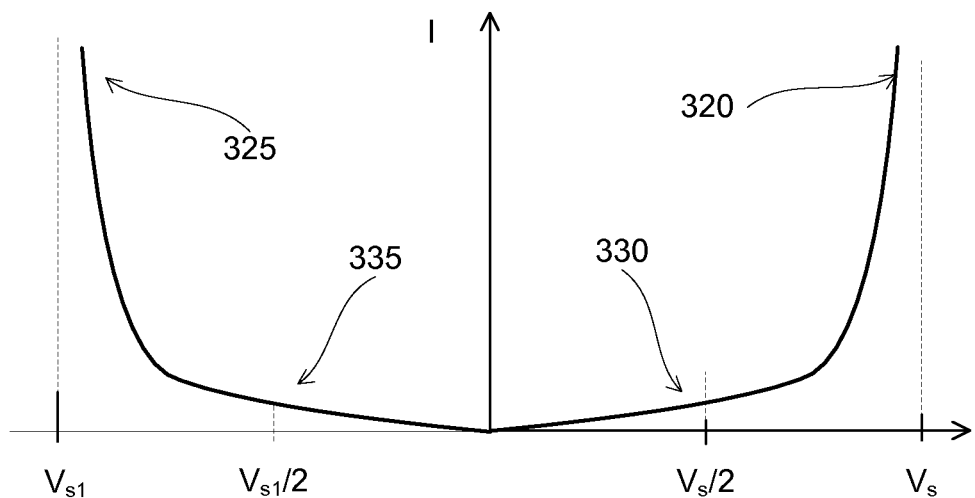

FIGS. 3A-3B illustrate examples of I-V response for a selector device according to some embodiments. In FIG. 3A, a current voltage response, e.g., I-V curve, for a selector device is shown. The current can start from low current (e.g., zero current) at zero voltage, and can increase until the switching voltage $V_s$, such as the reset voltage $V_{reset}$. The current can slowly increase for low voltages, e.g., less than $V_s/2$, and then rapidly increase toward the switching voltage $V_s$. The low current at the vicinity of zero voltage can reduce the leakage current. For example, the current density 330 at half the switching voltage can be less than about $10^3$ A/cm$^2$ to prevent accidental changes to the memory cells. At high voltages, such as at the switching voltage $V_s$, the current can be very high to prevent any interference with the operation of the memory devices. For example, the current density 320 at the switching voltage can be higher than about $10^6$ or $10^7$ A/cm$^2$ so that the voltage drop across the selector device is small. At opposite voltage, the current density 340 can be small, e.g., negligible, to be used as a diode for unipolar memory cells.

FIG. 3B shows a current response for a selector device that can be used for bipolar memory cells. The current response curve can be similar in both positive and negative polarities. For example, in the positive voltages, the current can be small 330 at $V_s/2$, and very large 320 at $V_s$. For negative voltages, the current behavior can be similar, e.g., small 335 at half an switching voltage $V_{s1}/2$, and large 325 at the switching voltage $V_{s1}$. As shown, both curves are plotted on the upper half of an I-V coordinate, but in general, the left half can be plotted on an (−I)-(V) axis while the right half can be plotted on I-V axis. This approach can account for a linear-log plot, for example, with the voltage axis being linear and the current axis being logarithm.

In some embodiments, the curves can be symmetrical, e.g., $V_s = V_{s1}$. For example, in bipolar memory cell, the set voltage $V_{set}$ and reset voltage $V_{reset}$ can have similar magnitudes with opposite polarities. In some embodiments, the curves can be asymmetrical, e.g., $V_s \neq V_{s1}$.

Unipolar selector can be appropriate for a unipolar memory such as PCM whereas bipolar selector can be more appropriate for a bipolar memory such as ReRAM and spin transfer torque random access memory (STT-RAM). The unipolar selector can have high resistance in reverse polarity. The bipolar selector can have high resistance at low voltages. These selectors can prevent sneak-through current even when adjacent memory elements are in low-resistance state. Furthermore, the non-linear I-V can also provide the current selector with low resistance at higher voltages so that there is no significant voltage drop across the current selector during switching.

In some embodiments, current selectors requiring low temperature processing (e.g., <650 C) are provided, which can be suitable for emerging non volatile memory architectures such as PCM and STT-RAM. In addition, the current selectors can include fab-friendly materials and can still exhibit a desired device performance.

In some embodiments, mixed ionic-electron conducting (MIEC) materials, and/or Ovonic threshold switching (OTS) devices are provided as unipolar or bipolar current selectors with low leakage at low voltages and high leakage at high voltages. OTS device can include a chalcogenide containing alloy that does not exhibit an amorphous to crystalline phase change. A chalcogenide material may be a material that includes at least one element from column VI of the periodic table or may be a material that includes one or more of the chalcogenide elements, e.g., any of the elements of tellurium, sulfur, or selenium.

The OTS device can operate as a switch that is either "off" or "on" depending on the amount of voltage potential applied across the memory cell. The "off" state can be a nonconductive state and the "on" state may be a conductive state, e.g., having lower resistance than the "off" state.

Materials for OTS device can include a chalcogenide material, e.g., tellurium, sulfur, and selenium, together with other additive materials such as arsenic, silicon, germanium, indium, phosphorus, and antimony. For example, an OTS device can have a composition of AsTeGeSi, $As_2Te_3Ge$, or $As_2Se_3Ge$.

OTS devices are promising as current selector as very low off-current leakage can be achieved, together with high current densities beyond a certain threshold voltage (Vth) between 1 and 2V. OTS devices can offer non-permanent change of state, e.g., there is no memory effect.

There are still significant challenges for OTS devices, including maintaining an amorphous phase after being subjected to backend processing thermal budget as well as after switching events, meeting endurance/cycling requirements and understanding of the switching mechanism, and optimizing the material complexity and manufacturability since many of the OTS materials have 3 or more elements (up to 6). Further, some of the elements of OTS devices are not as amenable to semiconductor high volume manufacturing, such as As, Se, S, and Te. In general, the challenges of optimal OTS devices can range from materials, integration, device and manufacturability. For example, $As_2Te_3$ based OTS devices can have good thermal stability but low breakdown strength and high off-state leakage current. In contrast, $As_2Se_3$ based OTS devices can have good breakdown strength and low off-state leakage current, but it could be difficult to optimally sputter deposit Se. Impurities additions can also improve the properties of the OTS devices, such as the addition of Ge and Si can improve thermal stability, while adding N can reduce the off state leakage. The high breakdown strength, e.g., Vbd, can be important because of the reliability issue, for example, the material should not breakdown after relatively high voltage, such as ~3V, application or extensive cycling, whereas it is important to maintain low off-state leakage to minimize the total leakage for a memory chip from the "unselected" memory cells.

In some embodiments, HPC screening processes are provided to obtain different critical requirements for OTS devices as NVM selector, for example, by balancing the requirements of maintaining amorphous phase after switching events through As addition with high thermal diffusivity, together with the requirements of increasing thermal stability through Ge and Si addition, and the requirements of high bandgap (leading to the increase of Vbd and the decrease of Ioff) through the replacement of Te with Se and/or S.

HPC approach can address the challenges of OTS materials to allow their adoption to high volume manufacturing. The HPC approach can screen OTS materials where large numbers of experiments can be conducted using simple quick-turn vehicles and obtain comprehensive data for their critical properties such as phase, composition, thermal stability, Vbd, and Ioff. For example, a screening strategy can include a primary screening which will have the highest experimental throughput of ~300 experiments per month and explore a large phase space. The primary screening workflows can be used to deposit multiple compositions and conditions on a single wafer, and composition, microstructure, band-gap, Vbd and Ioff of the OTS materials can be characterized. The promising candidates from this primary screening are carried forward to a secondary screening which can use a more sophisticated test-vehicle, e.g., overlap capacitor structures at geometries ≤1 μm. After the promising candidates from this secondary screening are further narrowed down, the OTS devices can be integrated with the NVM cell e.g., PCM or ReRAM in a large array at smaller geometries, 45 nm.

In addition to OTS devices, devices using mixed ionic-electronic conductors (MIEC) can also be used as current selector devices. MIEC are materials that conduct both ions and electrons or holes, and are typically ionic semiconductors, e.g., they can be doped with impurities to modulate electronics conductivity. Examples include $Ag_2S$, $Cu_8GeS_6$, in which Ag and Cu ions are mobile. The charge conduction then takes place via both ionic and electronic motion. The MIEC materials can be coupled with electrodes which can be blocking or diffusing, e.g., the mobile ions accumulate or diffuse through at the interface with electrode. When the electrode is blocking for ionic motion, the charge accumulation can retard further ionic transport, and hence, the electronic conduction as well to maintain charge neutrality. On the other hand, if the mobile ions are not blocked at the electrode, and can diffuse into the electrode, the ionic conduction is not impeded, and can continue to increase with applied voltage. Hence, the I-V behavior of a MIEC material can be modulated by choice of electrodes, and can be highly asymmetric if one electrode is blocking whereas the other one is not.

Materials for MIEC device can include copper, silver, germanium, and selenium. MIEC materials can also include a semiconductor containing positively or negative charged defects or ions acting as n-type or p-type dopants. For example, the material of the mixed ionic-electronic conductor can include CuAgGeSe, doped silicon, yttria-stabilized zirconia (YSZ), doped $SrTiO_3$, $CuO_x$, $CeO_x$ or NiO.

There are still significant challenges for MIEC devices, including complex material systems, not yet used in semiconductor high-volume manufacturing and not yet met the high reliability/endurance and fast switching speed required for NVM. For example, MIEC materials for current selectors are not well studied, and thus remaining largely unknown. In general, MIEC devices can include an inert electrode and another electrode containing, e.g., copper. Device performance is also not well established, thus the switching speed, the endurance and reliability, and the conduction mechanism of different MIEC materials are still needed to be evaluated. In addition, integration and manufacturing processes also need to evaluated, including etch and wet process interaction, memory cell compatibility, and deposition methods such as sputter target fabrication.

Other paths for developing MIEC devices can be evaluated, such as turning solid electrolytes into MIEC by increasing ionic mobility and adding dopants to introduce energy levels near conduction or valence band to increase electron or hole concentration. For example, higher electronic and ionic conductivity can provide high current required for NVM, as well as ensure no permanent filament remains in the material after the device turned off.

In some embodiments, HPC screening process is provided to obtain different critical requirements for MIEC devices as NVM selector, for example, by balancing the requirements of high electron current with optimum mobile ion such as copper concentration and dopant additions, high ion mobility to ensure filament self-dissipation in off states, and adjusting ion concentration, such as Ag, to control on-state voltage.

HPC approaches can address the challenges of MIEC materials to allow their adoption to high volume manufacturing. The HPC approach can screen MIEC materials where large numbers of experiments can be conducted using simple quick-turn vehicles and obtain comprehensive data for their critical properties such as phase, composition, thermal stability, Vbd, and Ioff. For example, primary screening workflows can be used to characterize basic material properties such as phase, composition and ionic and electronic conductivities for various MIEC and electrode stack combinations. A secondary screening can be used to test MIEC devices using short pulses, for example, to test MIEC device pulsed switching properties as well as conduction mechanism. Afterward, the MIEC devices can be integrated with the NVM cell e.g., PCM or ReRAM in a large array.

Figure 4A:
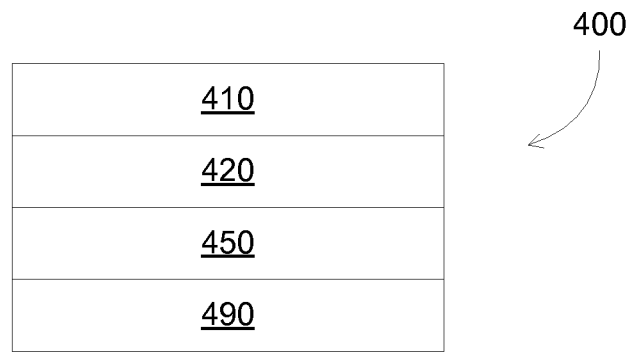
FIGS. 4A-4B illustrate an example of a current selector together with a memory stack incorporating the current selector according to some embodiments.
Figure 4B:
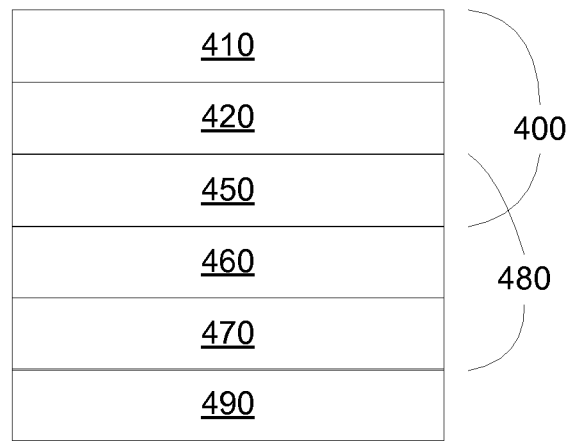

FIGS. 4A-4B illustrate an example of a current selector together with a memory stack incorporating the current selector according to some embodiments. In FIG. 4A, a current selector 400 can be disposed on a substrate 490, and can include a first layer of OTS or MIEC material 420 disposed between two electrodes 410 and 450. The first and second low leakage dielectric layers can be the same or can be different, e.g., different thicknesses or different materials. The two electrodes can be the same or can be different, e.g., different materials.

In FIG. 4B, a current selector 400 can be placed in series with a memory element 480, which is disposed on a substrate 490. The memory element can include a switching layer 460 sandwiched between two electrodes 450 and 470. As shown, the current selector 400 and the memory element 480 share a common electrode 450.

In some embodiments, provided is the development of current selectors using OTS or MIEC materials using a combinatorial workflow. The combinatorial workflow can identify the performance of the materials, the processes, and the fabricated devices, permitting a selection of materials and processing conditions to optimize the device performance in the fabrication of non volatile memory arrays.

"Combinatorial Processing" generally refers to techniques of differentially processing multiple regions of one or more substrates. Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.).

Combinatorial processing generally varies materials, unit processes or process sequences across multiple regions on a substrate. The varied materials, unit processes, or process sequences can be evaluated (e.g., characterized) to determine whether further evaluation of certain process sequences is warranted or whether a particular solution is suitable for production or high volume manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

Figure 5:
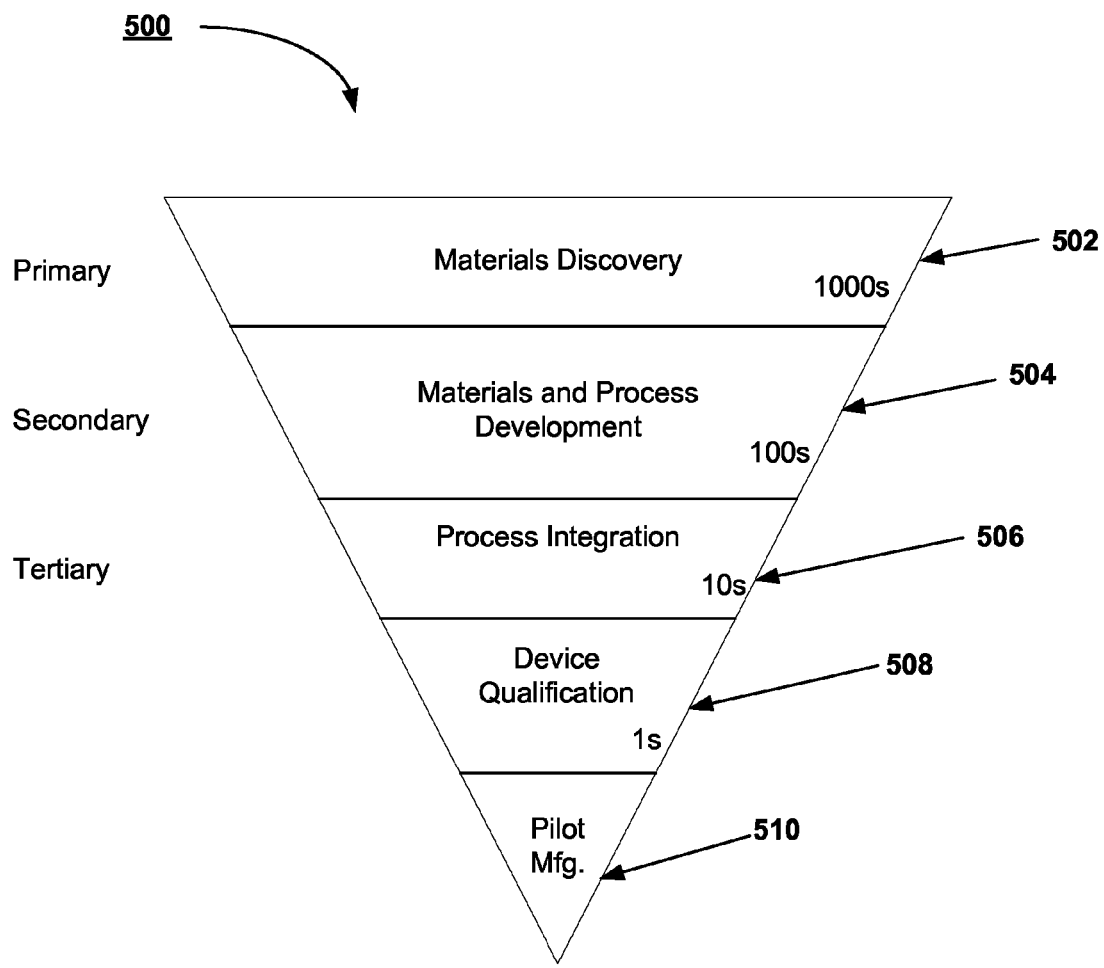
FIG. 5 illustrates a schematic diagram for implementing combinatorial processing and evaluation using primary, secondary, and tertiary screening.

FIG. 5 illustrates a schematic diagram for implementing combinatorial processing and evaluation using primary, secondary, and tertiary screening. The schematic diagram, 500, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 502. Materials discovery stage, 502, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 504. Evaluation of the materials is performed using metrology tools such as electronic testers and imaging tools (i.e., microscopes).

The materials and process development stage, 504, may evaluate hundreds of materials (i.e., a magnitude smaller than the primary stage) and may focus on the processes used to deposit or develop those materials. Promising materials and processes are again selected, and advanced to the tertiary screen or process integration stage, 506, where tens of materials and/or processes and combinations are evaluated. The tertiary screen or process integration stage, 506, may focus on integrating the selected processes and materials with other processes and materials.

The most promising materials and processes from the tertiary screen are advanced to device qualification, 508. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 510.

The schematic diagram, 500, is an example of various techniques that may be used to evaluate and select materials and processes for the development of new materials and processes. The descriptions of primary, secondary, etc. screening and the various stages, 502-510, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of high-k device fabrication process with metal gate by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a high-k device. A global optimum sequence order is therefore derived, and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate which are equivalent to the structures formed during actual production of the high-k device. For example, such structures may include, but would not be limited to, high-k dielectric layers, metal gate layers, spacers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 6:
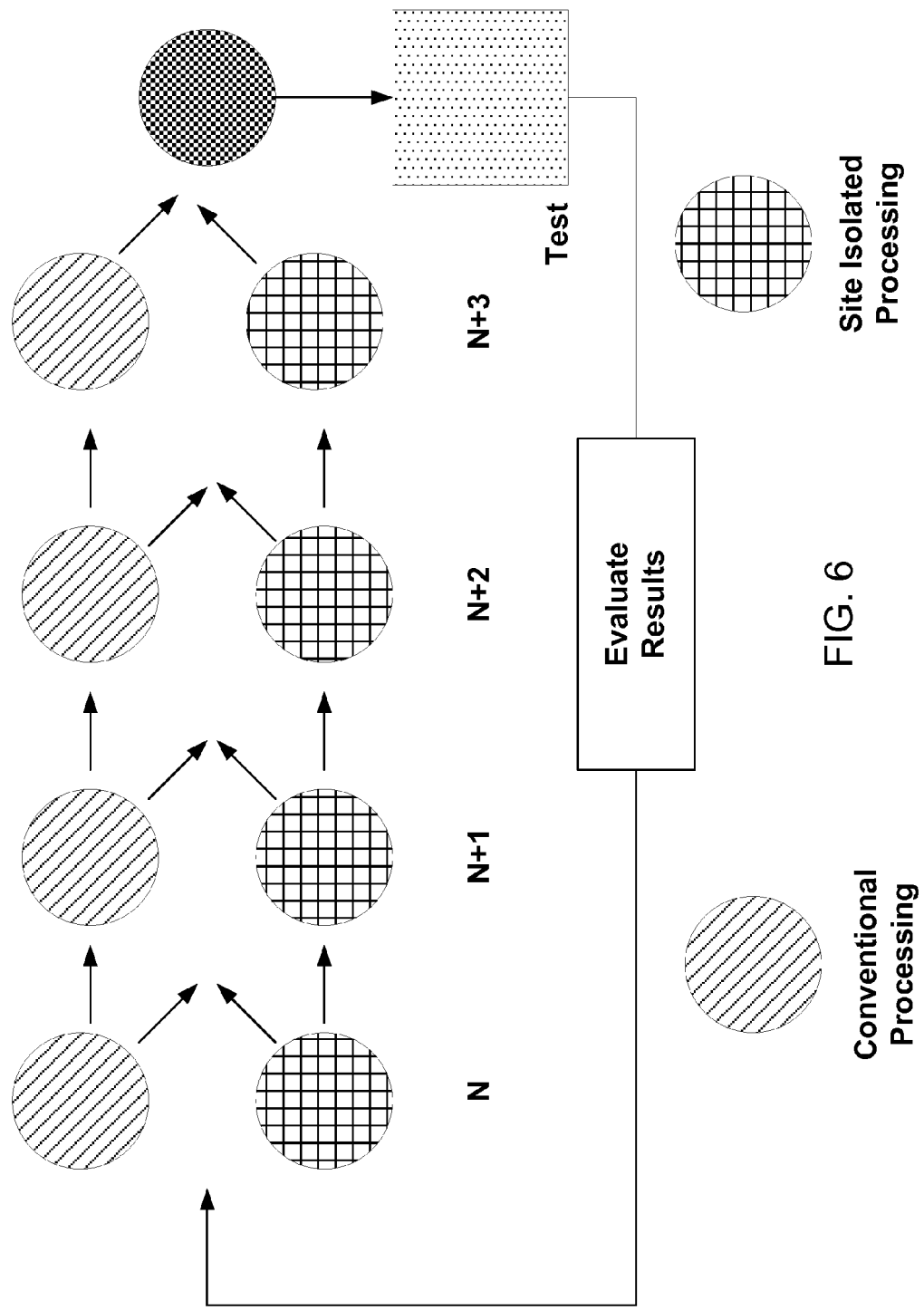
FIG. 6 is a simplified schematic diagram illustrating a general methodology for combinatorial process sequence integration that includes site isolated processing and/or conventional processing in accordance with some embodiments.

FIG. 6 is a simplified schematic diagram illustrating a general methodology for combinatorial process sequence integration that includes site isolated processing and/or conventional processing in accordance with some embodiments. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 6. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.). Combinatorial processing can be used to determine optimal processing parameters (e.g., time, concentration, temperature, stirring rate, etc.) of wet processing techniques such as wet etching, wet cleaning, rinsing, and wet deposition techniques (e.g., electroplating, electroless deposition, chemical bath deposition, etc.).

Figure 7:
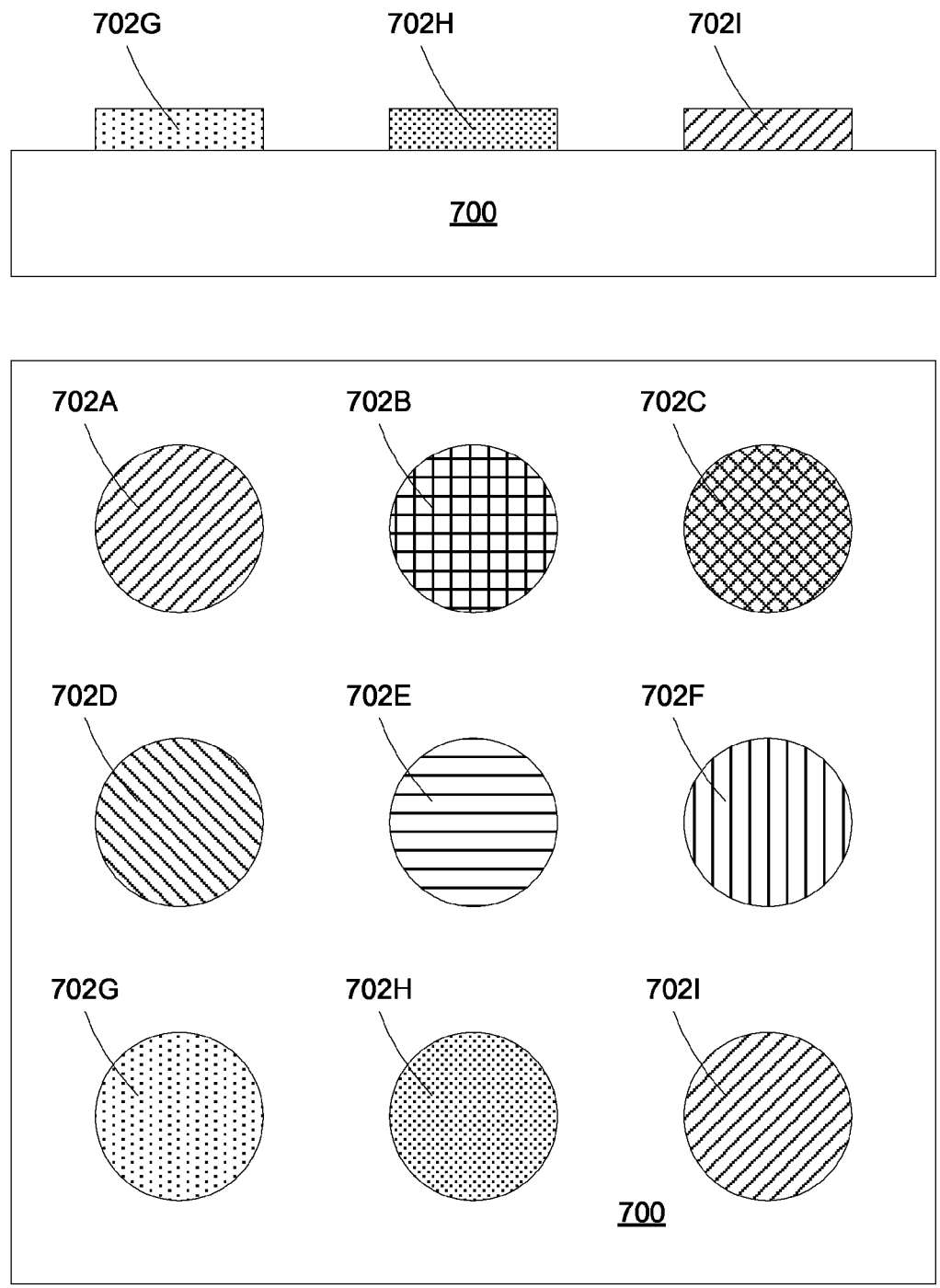
FIG. 7 illustrates a schematic diagram of a substrate that has been processed in a combinatorial manner.

FIG. 7 illustrates a schematic diagram of a substrate that has been processed in a combinatorial manner. A substrate, 700, is shown with nine site isolated regions, 702a-702i, illustrated thereon. Although the substrate 700 is illustrated as being a generally square shape, those skilled in the art will understand that the substrate may be any useful shape such as round, rectangular, etc. The lower portion of FIG. 7 illustrates a top down view while the upper portion of FIG. 7 illustrates a cross-sectional view taken through the three site isolated regions, 702g-702i. The shading of the nine site isolated regions illustrates that the process parameters used to process these regions have been varied in a combinatorial manner. The substrate may then be processed through a next step that may be conventional or may also be a combinatorial step as discussed earlier with respect to FIG. 6.

In some embodiments, the dielectric layer is formed through a deposition process, such as chemical vapor deposition (CVD), atomic layer deposition (ALD), or physical vapor deposition (PVD). The metal electrode layer can be formed by PVD, CVD or ALD through a shadow mask or by a lithography patterning process.

Figure 8:
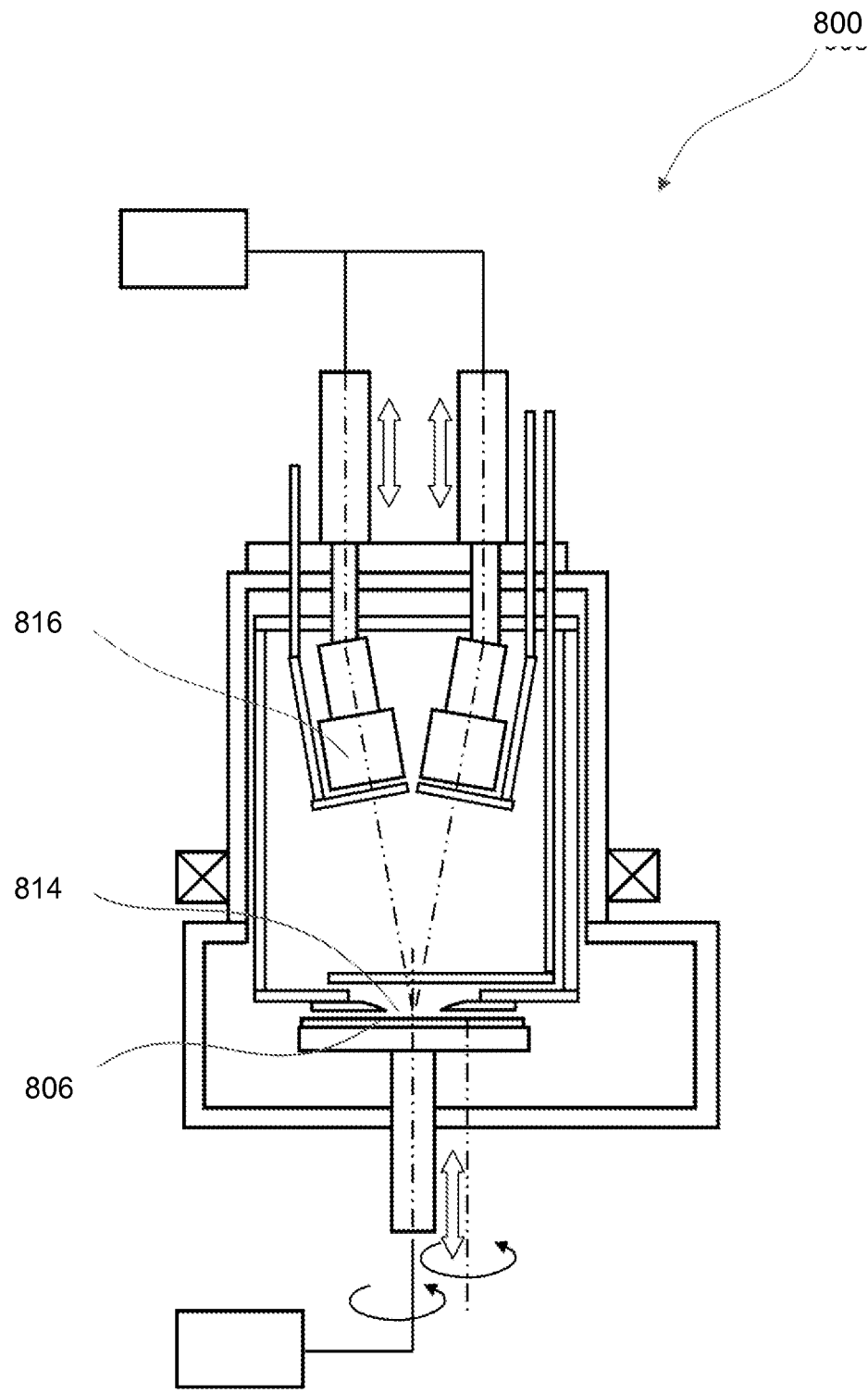
FIG. 8 illustrates a simplified schematic diagram illustrating a PVD process chamber configured to perform combinatorial processing.

FIG. 8 illustrates a simplified schematic diagram illustrating a PVD process chamber configured to perform combinatorial processing. The PVD system 800, sometimes commonly called a sputter system, generally includes a process chamber, one or more sputtering sources, and a transport system capable of positioning the substrate such that any area of the substrate can be exposed to sputtered material. The apparatus can further include an aperture positioned under each sputtering source, with the aperture oriented normal to the substrate and located adjacent to but not touching the substrate. The aperture typically has an opening smaller than the substrate so that discrete regions of the substrate can be subjected to distinct process conditions in a combinatorial manner. However, there is no particular limit on the size of the aperture. Typical apertures can range from a minimum of about 10 mm in one dimension, and can be square, round, or rectangular, for example. For combinatorial processing, the apertures are small enough such that films can be deposited on a plurality of site-isolated regions on a substrate. For high deposition rate sputtering to coat an entire substrate, the aperture can be up to approximately full substrate size.

The process chamber provides a controlled atmosphere so that sputtering can be performed at any gas pressure or gas composition necessary to perform the desired combinatorial processing. Typical processing gases include argon, oxygen, hydrogen, or nitrogen. However, additional gases can be used as desired for particular applications.

The transport system can include a substrate support capable of controlling substrate temperature up to about 550 C., and applying a bias voltage of a few hundred volts.

In a sputter system 800, a plurality of sputtering sources 816 are positioned at an angle so that they can be aimed through a single aperture 814 to a site-isolated region on a substrate 806. The sputtering sources 816 are positioned about 100-300 mm from the aperture 814 to ensure uniform flux to the substrate within the site-isolated region. Details of the combinatorial PVD system are described in U.S. patent application Ser. No. 12/027,980 filed on Feb. 7, 2008 and U.S. patent application Ser. No. 12/028,643 filed on Feb. 8, 2008, which are herein incorporated by reference.

In some embodiments, a deposition process can be performed in the sputter system 800 in a combinatorial manner. The combinatorial deposition process generally includes exposing a first site-isolated region of a surface of a substrate to material from a sputtering source under a first set of process parameters, and exposing a second site-isolated region of a surface of the substrate to material from a sputtering source under a second set of process parameters. During exposure of the surface of the substrate to the sputtering source, the remaining area of the substrate is not exposed to the material from the sputtering target, enabling site-isolated deposition of sputtered material onto the substrate. The combinatorial process can further include exposing three or more site-isolated regions of the substrate to material from a sputtering source under distinct sets of process parameters. The combinatorial process can further comprise depositing additional layers onto any site-isolated region to build multi-layered structures if desired. In this manner, a plurality of process conditions to deposit one or a plurality of layers can be explored on a single substrate under distinct process parameters.

The process parameters that can be combinatorially varied generally comprise sputtering parameters, sputtering atmosphere parameters, substrate parameters, or combinations thereof. Sputtering parameters typically comprise exposure times, power, sputtering target material, target-to-substrate spacing, or a combination thereof. Sputtering atmosphere parameters typically comprise total pressure, carrier gas composition, carrier gas flow rate, reactive gas composition, reactive gas flow rate, or combinations thereof. The reactive gas flow rate can be set to greater than or equal to zero in order to vary the reactive gas composition in an inert carrier gas. The substrate parameters typically comprise substrate material, surface condition (e.g., roughness), substrate temperature, substrate bias, or combinations thereof.

Substrates can be a conventional round 200 mm, 300 mm, or any other larger or smaller substrate/wafer size. In other embodiments, substrates may be square, rectangular, or other shape. One skilled in the art will appreciate that substrate may be a blanket substrate, a coupon (e.g., partial wafer), or even a patterned substrate having predefined regions. In some embodiments, a substrate may have regions defined through the processing described herein.

In some embodiments, high productivity combinatorial process is used for screening OTS materials and processes for Ovonic threshold switching current selectors of a cross point memory array. Feasibility for Ovonic threshold switching devices in memory array has been shown. For example, high forward current density at feature size of 90 nm, together with the switching time and endurance has been shown for phase change memory array. The ratio of forward and reverse current, and the ratio of forward current at switching voltage and at half of the switching voltage have been shown to meet the requirement of phase change memory array. Low temperature (e.g., less than 400 C) processes have been shown, but the thermal stability remains an issue.

In some embodiments, high productivity combinatorial process is used for screening OTS materials and processes for Ovonic threshold switching current selectors of a cross point memory array. Feasibility for Ovonic threshold switching devices in memory array has been shown. For example, high forward current density at feature size of 90 nm, together with the switching time and endurance has been shown for phase change memory array. The ratio of forward and reverse current, and the ratio of forward current at switching voltage and at half of the switching voltage have been shown to meet the requirement of phase change memory array. Low temperature (e.g., less than 400 C) processes have been shown, but the thermal stability remains an issue.

In some embodiments, the use of HPC can permit the explanation of a large set of manufacturable materials and processes, which can allow faster incorporation of OTS or MIEC current selectors in memory arrays in a fabrication facility. For example, HPC processes can screen various OTS or MIEC and processes to improve thermal stability, endurance, and manufacturability, together with understanding the switching mechanism for better integration.

In some embodiments, HPC can evaluate different chalcogenide materials for OTS devices, e.g., S, Se, and Te, together with different additives, e.g., As, Ge, Si, and N. Different compositions and ratios can be screened to obtain optimal materials for the selection of OTS devices, such as a thermal stability at less than 400 C process, and an amorphous phase at post interconnection and post threshold switching.

In some embodiments, HPC can evaluate different mixed ionic electronic conductor materials for MIEC devices, such as Cu, Ag, Ge, and Se. Different compositions and ratios can be screened to obtain optimal materials for the selection of MIEC devices, such as a thermal stability at less than 400 C process, and high ionic and electronic conductivity when the device is on and no permanent remaining filament when the device is off.

Further, the OTS or MIEC materials and processes can be screened for device characteristics, such as Vbd, Ioll, Vth variability, endurance and reliability. The integration requirements can also be studied, such as the interaction of the OTS or MIEC device fabrication processes with the etch and wet processes, together with the compatibility with the memory cell. The manufacturability of the OTS or MIEC devices and processes can also be evaluated, including deposition processes and support operations, such as sputter target fabrication.

Figure 9:
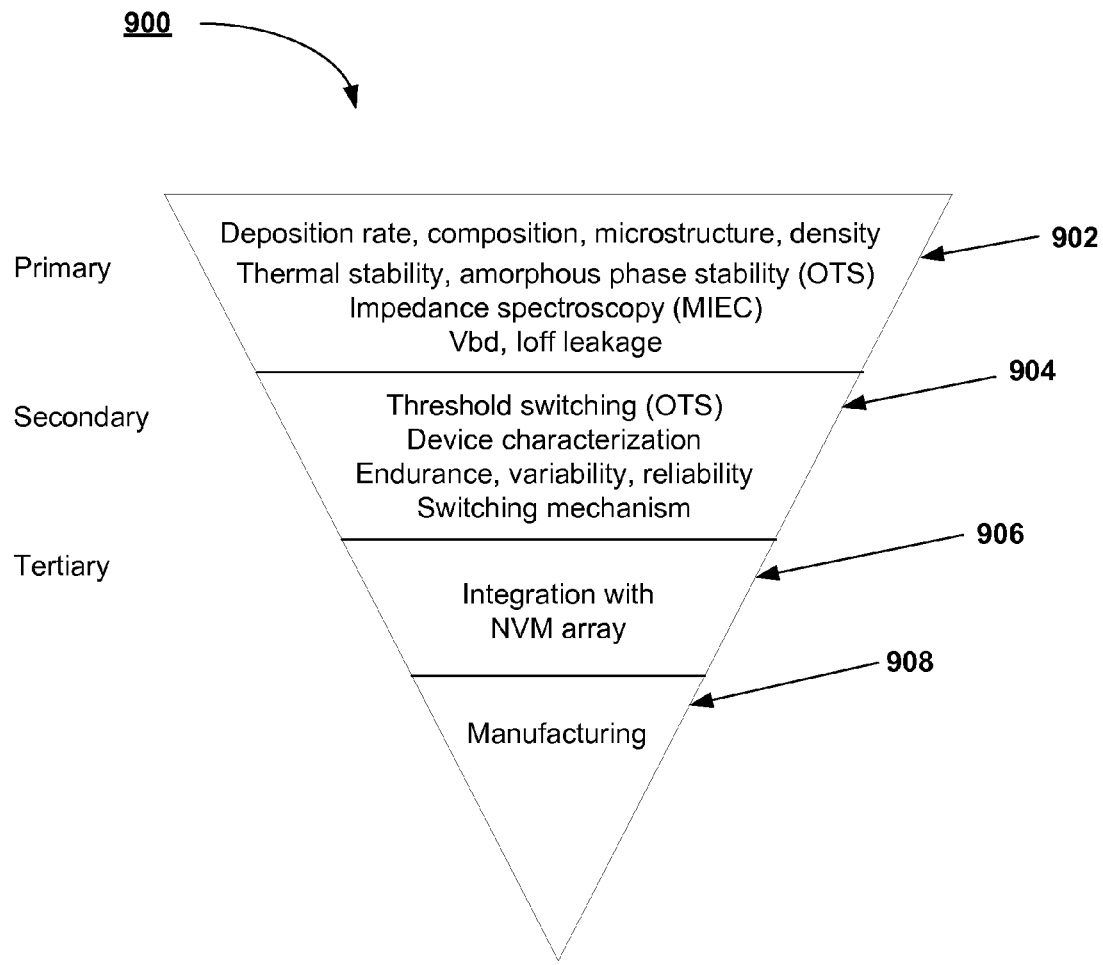
FIG. 9 illustrates a schematic diagram for implementing combinatorial processing and evaluation for OTS or MIEC materials and processes, according to some embodiments.

FIG. 9 illustrates a schematic diagram for implementing combinatorial processing and evaluation for OTS or MIEC materials and processes, according to some embodiments. The combinatorial processing includes a primary screen, a secondary screen, and a tertiary screen, before bringing the OTS or MIEC devices to the manufacturing facility.

In the primary screen 902, different materials, compositions and additives, together with process conditions are evaluated to obtain deposition rate, composition, microstructure, density, together with thermal stability, amorphous phase stability (for OTS), and ionic and electronic conductivity (for MIEC), breakdown voltage Vbd, and off-state leakage current Ioff. Blanket films can be used for the evaluation of the materials using material characterization tools such as ellipsometer for thickness measurement, deposition rate measurement, X-ray fluorescence (XRF), X-ray reflectivity (XRR), and X-ray diffraction (XRD) measurements before and after a heat treatment. Simple metal-insulator-metal (MIM) structures can be used for electrical characterization of Vbd, Ioff, and ionic and electronic conductivity. The promising candidates are advanced to the secondary screen 904.

The secondary screen stage 904 can evaluate threshold switching of the materials, together with endurance, variability, and reliability of the current selector devices. In addition, switching mechanism can be studied for guidance in the direction of material development. Isolated MIM structures can be used with pulsed I-V measurements. The promising candidates are advanced to the tertiary screen stage 906. The tertiary screen stage 906 can evaluate integration issues of the current selectors with memory arrays, for example, through measurement of the performance of the memory array. The best candidates are selected for manufacturing stage 908.

Figure 10:
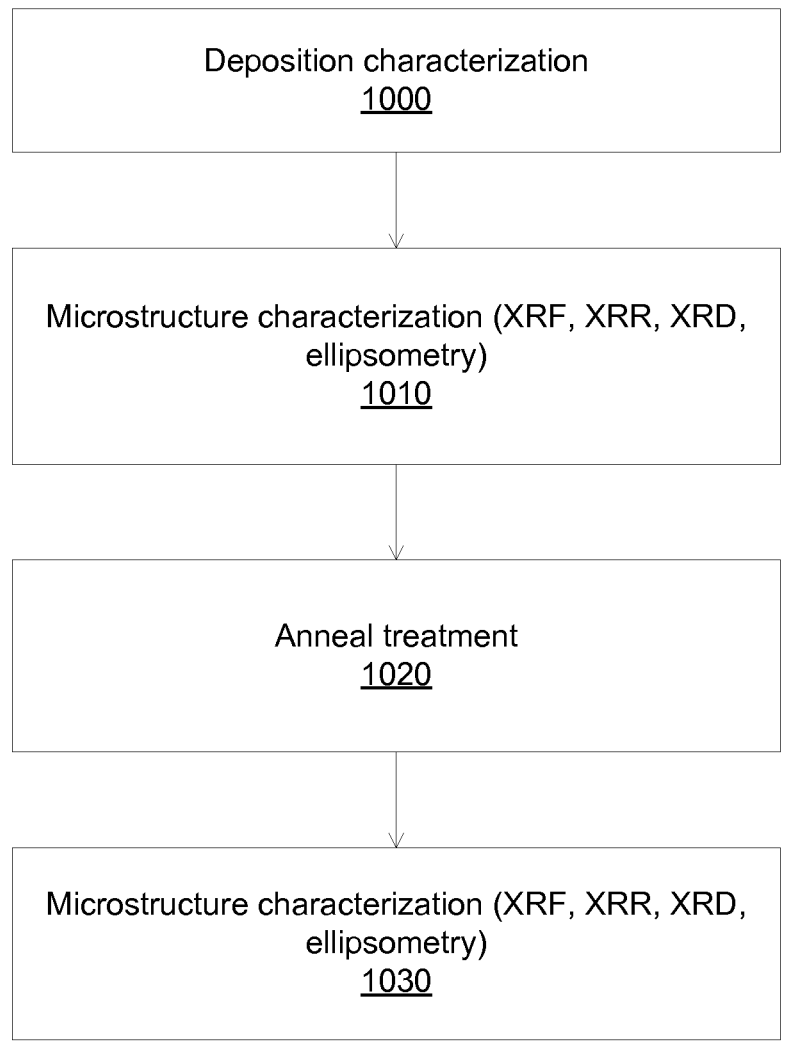
FIG. 10 illustrates a flowchart for blanket film characterization according to some embodiments.

FIG. 10 illustrates a flowchart for blanket film characterization according to some embodiments. In operation 1000, the deposition behavior is characterized, such as deposition rate measurement, repeatability and variability of the deposition process. In operation 1010, material characterization can be performed, such as ellipsometer measurements for measuring thickness, XRF, XRR and XRD for elemental and chemical analysis, such as the crystallinity of the materials. In operation 1020, a heat treatment is performed on the deposited film. In operation 1030, the annealed film is measured again. The characterization before and after a heat treatment can provide data on the thermal stability of the materials.

Figure 11:
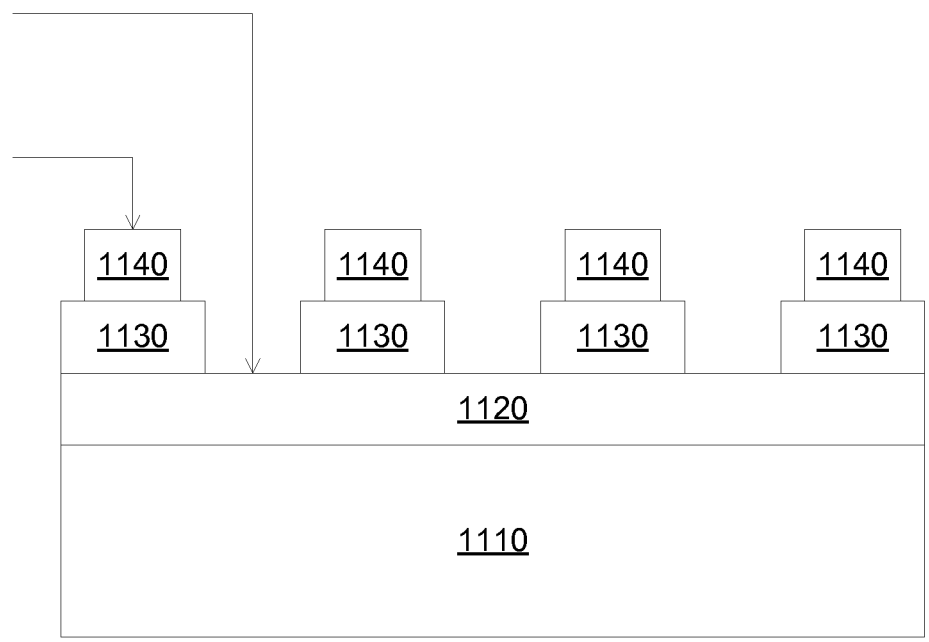
FIG. 11 illustrates simple metal-insulator-metal (MIM) structures for electrical measurements according to some embodiments.

FIG. 11 illustrates simple metal-insulator-metal (MIM) structures for electrical measurements according to some embodiments. A bottom electrode layer 1120 can be deposited on a substrate 1110. Current selector materials 1130, e.g., OTS or MIEC devices, can be deposited in site isolation regions. Top electrodes 1140 can be deposited on the current selector materials 1130, for example, by a shadow mask process. A MIM structure can be formed, allowing the measurement of breakdown voltage, leakage current, and ionic and electronic conductivity.

Figure 12:
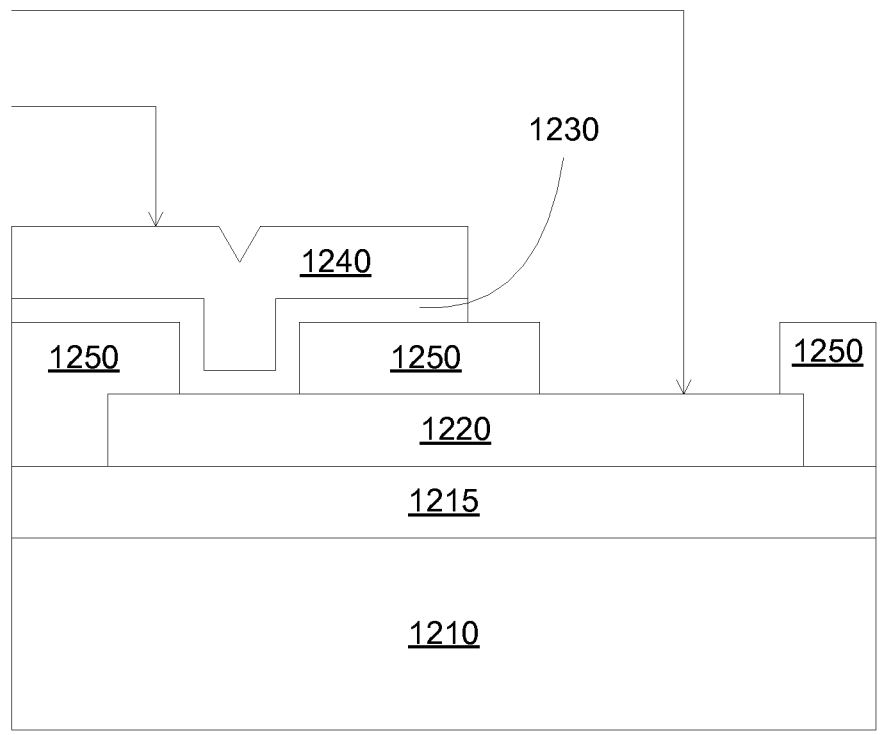
FIG. 12 illustrates isolated MIM structures for electrical measurements according to some embodiments.

FIG. 12 illustrates isolated MIM structures for electrical measurements according to some embodiments. A dielectric layer 1215 can be deposited on a substrate 1210, for example, to isolate the substrate from the subsequently formed devices. Bottom electrode 1220 can be formed, for example, by a deposition process followed by a patterning process. Isolation layer 1250 can be formed on the bottom electrode 1220, for example, by a deposition process followed by a patterning process. The patterning process can provide openings in the isolation layer 1250 for the MIM structures and for probing the bottom electrode 1220. Current selector materials 1230, e.g., OTS or MIEC devices, and top electrodes 1240 can be formed in site isolated regions. A capacitor structure can be formed, allowing the characterization of the current selector devices, for example, the threshold voltage, the on-state current, and the off-state current, together with the switching mechanism (for OTS) and conduction mechanism (for MIEC). DC and AC testing of the MIM structures can be performed, for example, by pulsed voltage measurements.

Figure 13:
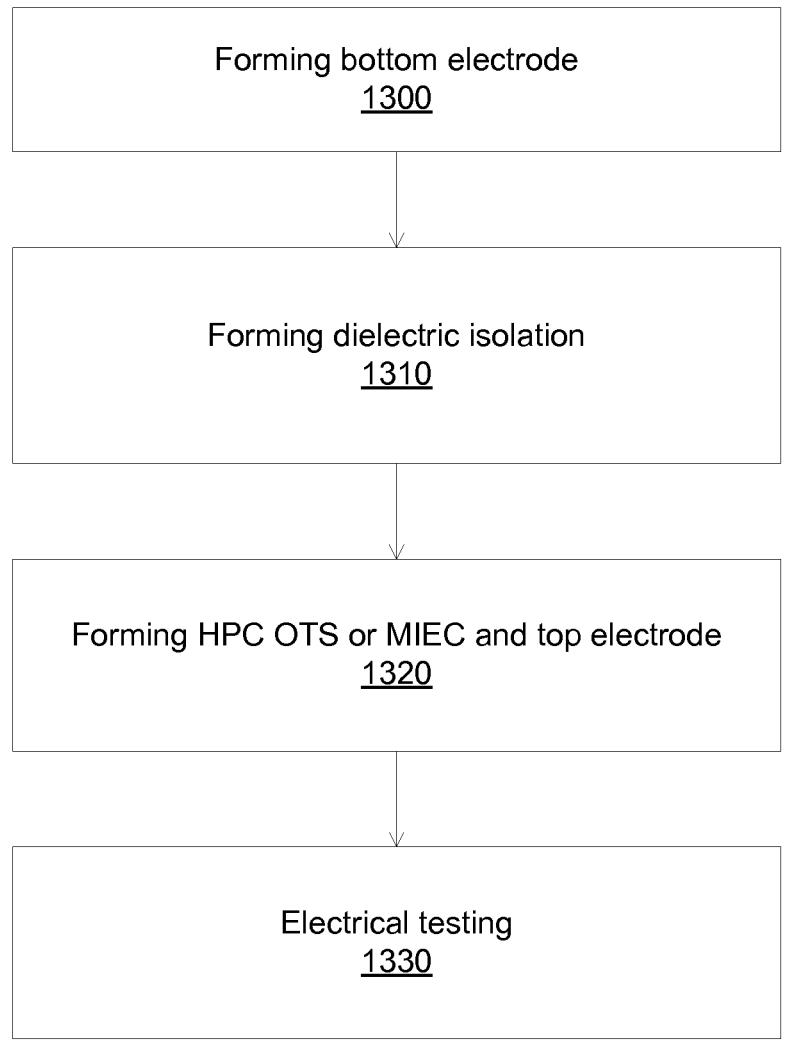
FIG. 13 illustrates a flowchart for isolated MIM structures characterization according to some embodiments.

FIG. 13 illustrates a flowchart for isolated MIM structures characterization according to some embodiments. In operation 1300, the bottom electrodes can be formed. In operation 1310, the dielectric isolation layer can be formed. In operation 1320, the OTS or MIEC materials, together with the top electrodes, can be formed in site isolated regions. In operation 1330, the MIM structures are electrically measured.

FIG. 14 illustrates a flowchart for a combinatorial processing of materials for current selectors according to some embodiments. The current selector materials and processes are varied in multiple site isolation regions, which are then measured. The characterization of the current selectors can indicate the performance and possible side effects of the materials and fabrication processes, permitting an optimization of various materials and process conditions. Poor performance chemicals and conditions can be identified and removed without the need to fabricate and test fully-operational devices.

In operation 1400, a first layer is formed over a substrate. The substrate can be any substrate, such as a semiconductor substrate. The first layer can include a chalcogenide material for forming an ovonic threshold switch. The first layer can include a mixed ionic electronic conductor for forming a non linear I-V device. The first layer can be formed on a bottom electrode, for example, to allow electrical characterization of the first layer.

In operation 1410, a top electrode can be formed on the first layer. The top electrode can be used for electrical characterization of the first layer. Alternatively, the top electrode formation can be optional, for example, to characterize the material characteristics of the first layer. Photolithography patterning processes can be performed, etching the electrodes and the dielectric layer to form device structures.

The first layer can be characterized. The characterization can include structural observation, such as by SEM (scanning electron microscope), ellipsometry, XRF, XRD, and XRR. The characterization can include electrical measurement, such as Vbd, Ioff, switching threshold, ionic and electronic conductivity.

In some embodiments, the present invention discloses combinatorial workflow for evaluating materials and process conditions for current selector devices, such as OTS devices or MIEC devices. High productivity combinatorial processing can be a fast and economical technique for structurally and electrically screening materials and their compositions to determine their possible side effects on the memory array performance, allowing optimum integration and avoiding potentially costly device process development through proper selection of current selector materials and processes.

Figure 15:
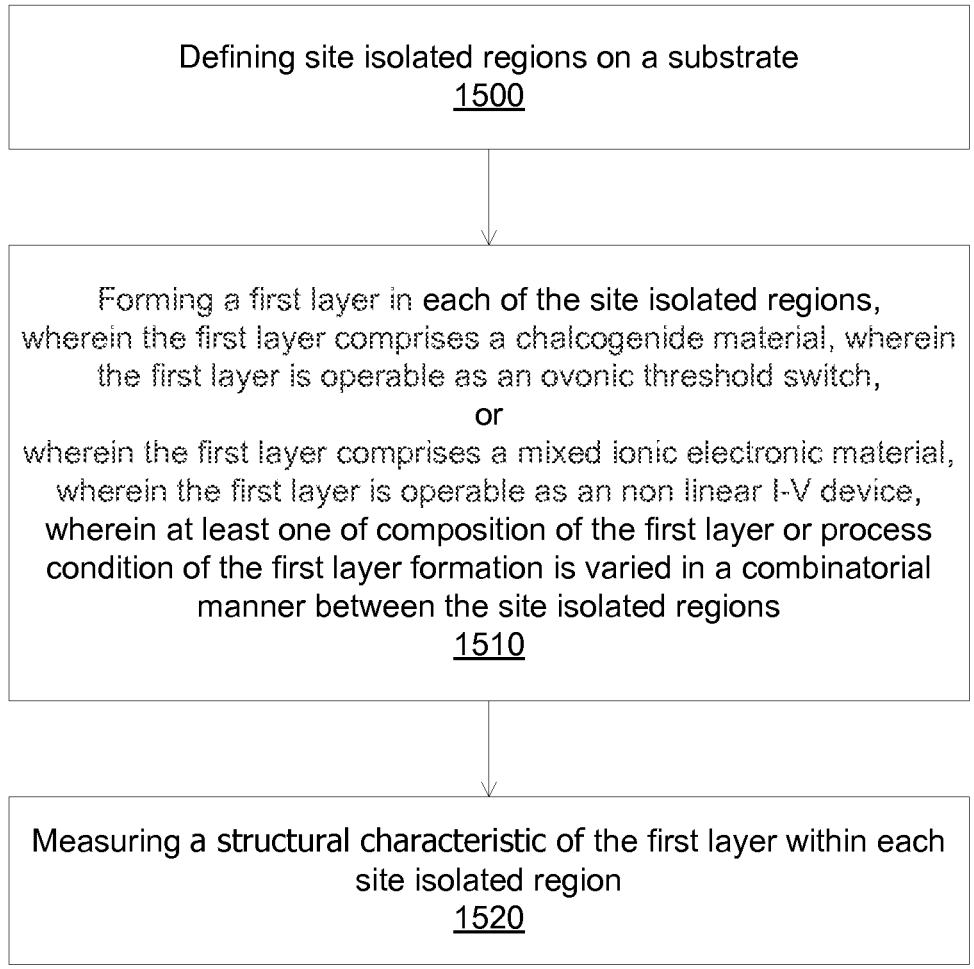
FIG. 15 illustrates a flowchart for HPC structural evaluations of current selector materials according to some embodiments.

FIG. 15 illustrates a flowchart for HPC structural evaluations of current selector materials according to some embodiments. In operation 1500, site isolated regions are defined on a substrate. In operation 1510, a first layer is formed in each site isolated region. The first layer can be formed by a deposition process, such as physical vapor deposition (PVD), atomic layer deposition (ALD), chemical vapor deposition (CVD), or any other deposition techniques. The first layer can include a chalcogenide material for operable as an ovonic threshold switching, or a mixed ionic electronic conductor for a non linear I-V device.

A composition of the first layer or a process condition of the first layer formation is varied in a combinatorial manner between the site isolated regions. For example, the elements of a chalcogenide first layer can include a combinatorial combination of the elements of Te, Se, S, As, N, Si, Ge, and any other material. The elements of a mixed ionic electronic conductor first layer can include a combinatorial combination of the elements of Cu, Ag, Ge, Se, and any other elements, such as N, P, Zn, W, Sb, F, CI, Br, and I. Further, the percentages of the elements can also vary in a combinatorial manner between the site isolated regions.

The process conditions of the first layer can be varied in a combinatorial manner between the site isolated regions. For example, a deposition technique, such as PVD, ALD, and CVD can be evaluated. Other process conditions can also be studied, such as the deposition conditions, and the conditions of a heat treatment, such as temperature, time and ambient.

In operation 1520, a structural characteristic of the first layer is measured in each site isolated region. For example, thickness, phase information and the stability of the structural characteristics, e.g., thermal stability, can be measured.

Figure 16:
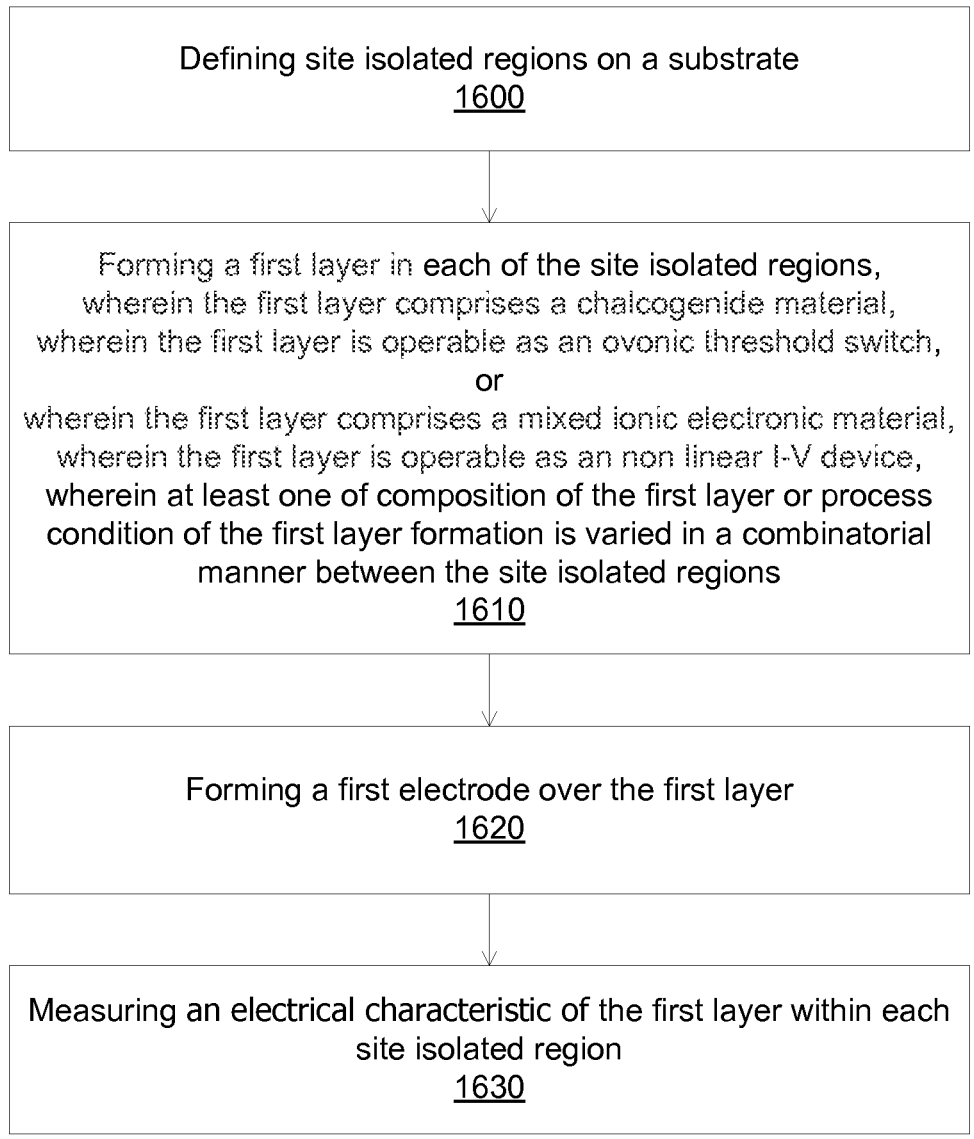
FIG. 16 illustrates a flowchart for HPC electrical evaluations of current selector materials according to some embodiments.

FIG. 16 illustrates a flowchart for HPC electrical evaluations of current selector materials according to some embodiments. The described flowchart is a general description of techniques used to form the current selectors described above. The flowchart describes techniques for forming a current selector generally including two electrodes and multiple layers disposed there between. Although certain processing techniques and specifications are described, it is understood that various other techniques and modifications of the techniques described herein may also be used. In operation 1600, site isolated regions are defined on a substrate. In operation 1610, a first layer is formed in each site isolated region. The first layer can be formed by a deposition process, such as physical vapor deposition (PVD), atomic layer deposition (ALD), chemical vapor deposition (CVD), or any other deposition techniques. The first layer can include a chalcogenide material for operable as an ovonic threshold switching, or a mixed ionic electronic conductor for a non linear I-V device.

A composition of the first layer or a process condition of the first layer formation is varied in a combinatorial manner between the site isolated regions. For example, the elements of a chalcogenide first layer can include a combinatorial combination of the elements of Te, Se, S, As, N, Si, Ge, and any other material. The elements of a mixed ionic electronic conductor first layer can include a combinatorial combination of the elements of Cu, Ag, Ge, Se, and any other elements, such as N, P, Zn, W, Sb, F, Cl, Br, and I. Further, the percentages of the elements can also be varied in a combinatorial manner between the site isolated regions.

The process conditions of the first layer can be varied in a combinatorial manner between the site isolated regions. For example, a deposition technique, such as PVD, ALD, and CVD can be evaluated. Other process conditions can also be studied, such as the deposition conditions, and the conditions of a heat treatment, such as temperature, time and ambient.

In some embodiments, a bottom electrode can be formed under the first layer. The elements and the percentages of the elements of the bottom electrode can be varied in a combinatorial manner between the site isolated regions. For example, the electrode can include inert elements, Cu, and other materials, such as Ge, and W.

In operation 1620, a top electrode can be formed over the first layer. In some embodiments, the elements and the percentages of the elements of the top electrode can be varied in a combinatorial manner between the site isolated regions. For example, the electrode can include inert elements, Cu, and other materials, such as Ge, and W. The first layer and the electrodes can be patterned to form MIM devices in the site isolated regions.

In operation 1630, an electrical characteristic of the MIM devices is measured in each site isolated region. For example, breakdown voltage, leakage current, e.g., current when the device is off, such as at half an switching voltage, conduction current, e.g., current when the device is on, such as at the switching voltage, and the conductivity of ionic and electronic portions in the first layer. For example, a leakage current can be less than about $10^3$ A/cm$^2$ at 2 V at less than 3 µm device dimension. A conduction current can be higher than about $10^6$ A/cm$^2$ at 2 V at less than 3 µm device dimension.

The current selector devices can be fabricated at different dimensions, such as less than 100 nm to 10 um. The devices can be used to study a switching performance of OTS or MIEC devices at very short pulse widths of nano or microseconds durations, e.g., less than about 100 ns, or less than about 1 us, which are typically used for NVM application. The switching currents for OTS or MIEC devices can be measured during the pulse, allowing the conduction mechanism associated with OTS to be understood.

Other electrical characteristics can be measured, such as threshold switching voltages, I-V characteristics, and the switching mechanisms of the first layer. Other properties can also be measured, such as endurance, variability, repeatability, and compatibility with other processes such as etching.

Figure 17:
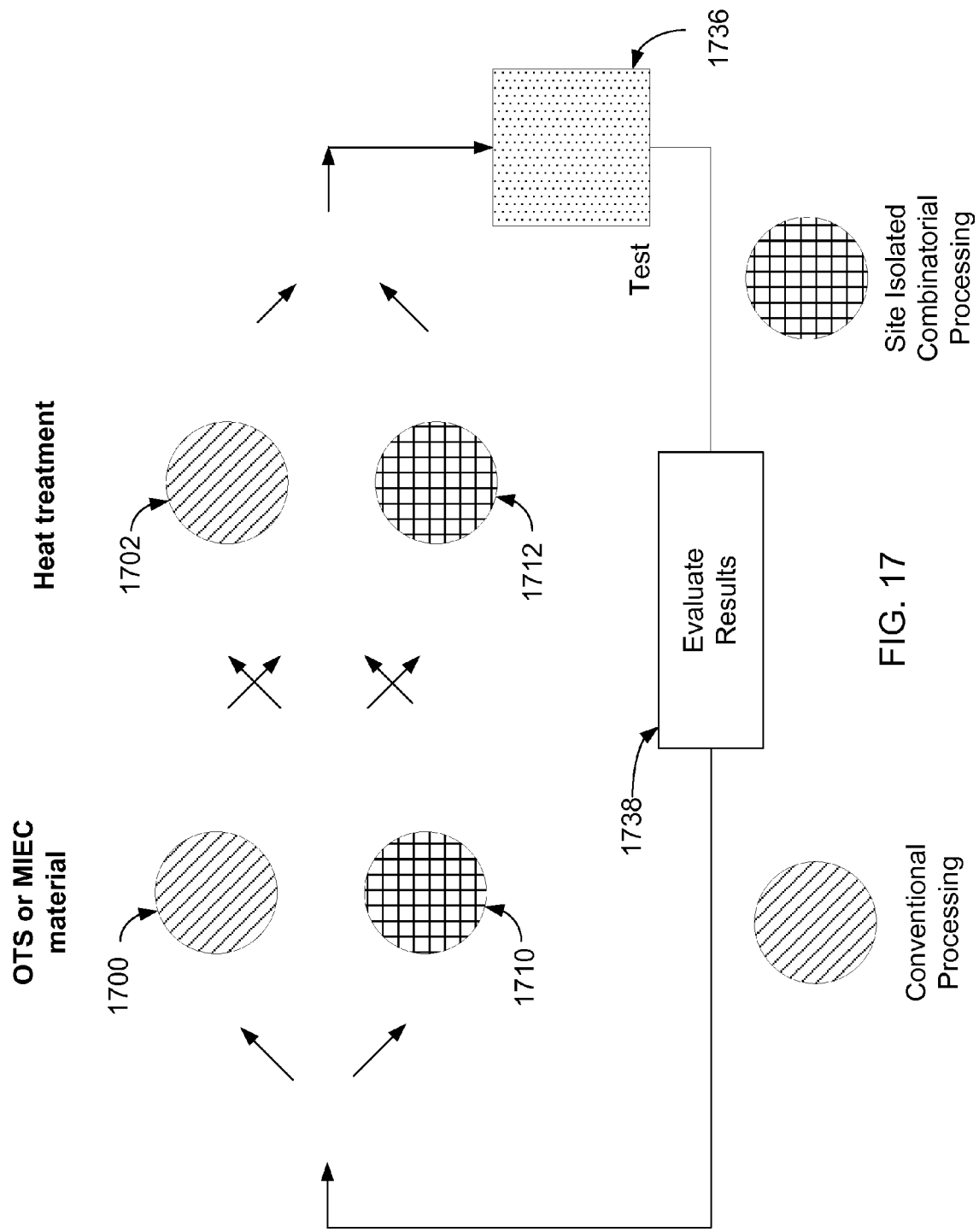
FIG. 17 illustrates a flow diagram for forming simple test structures according to some embodiments.

FIG. 17 illustrates a flow diagram for forming simple test structures according to some embodiments. As discussed above, several of the layers or process steps provide opportunities to apply combinatorial techniques to the development and investigation of the materials and treatments for the layers. For evaluating material characteristics of the current selectors, e.g., OTS or MIEC devices, parameter candidates include the OTS or MIEC layer (e.g., a chalcogenide alloy or a mixed ionic electronic conductor), and the anneal or heat treatment process. As mentioned previously, examples of suitable materials for a current selector layer include Te, Se, S, As, N, Si, Ge for OTS devices, and Cu, Ag, Ge, Se, N, P, Zn, W, Sb, F, Cl, Br, and I for MIEC devices. The current selector layer can be deposited using chemical vapor deposition (CVD), atomic layer deposition (ALD), or plasma enhanced CVD or ALD. The effects of materials on the current selector layer can be investigated using HPC techniques by varying process parameters such as material elements and composition, deposition process condition, anneal conditions, surface preparation process, interface layer, surface cleaning process conditions. These are meant to be illustrative parameters and those skilled in the art will be able to apply HPC techniques to any of the commonly used process parameters.

Typically, PVD is the preferred method of deposition for the current selector layer. The deposition of the layers by PVD may be investigated using HPC techniques by varying process parameters such as material, power, pressure, target to substrate distance, atomic ratio, etc. These are meant to be illustrative parameters and those skilled in the art will be able to apply HPC techniques to any of the commonly used process parameters.

Returning to FIG. 17, through the use of a combination of conventional and combinatorial processing systems (i.e. systems capable of processing multiple isolated regions on a single substrate) a number of trajectories through the various systems illustrated in the flow diagram of FIG. 17 can be envisioned. In FIG. 17, the current selector layer may be deposited in a conventional processing manner, 1700, or in a site isolated combinatorial processing manner, 1710. The current selector layer may be annealed in a conventional processing manner, 1702, or in a site isolated combinatorial processing manner, 1712. After the deposition of the current selector layer and the subsequent annealing process, the layers represented by each of the site isolated regions may be tested in step 1736, and the results evaluated in step 1738. As discussed previously, the results will form the basis for additional cycles of investigation through HPC techniques to identify materials and process conditions that evaluate the suitability of cleaning processes in devices having the given gate dielectric and metal gate electrode and conductor.

Using the simple diagram in FIG. 17, there are four possible trajectories through the process sequence, which encompass all of the possible combinations of conventional and combinatorial processing illustrated. Those skilled in the art will understand that HPC techniques may be applied to other processes not illustrated such as etching, surface treatments, surface functionalization, etc. As more variable process steps are included, the total number of required experiments increases dramatically. This illustrates the benefits of using HPC techniques to limit the number of substrates to a manageable number and minimize the cost of the development program.

Figure 18:
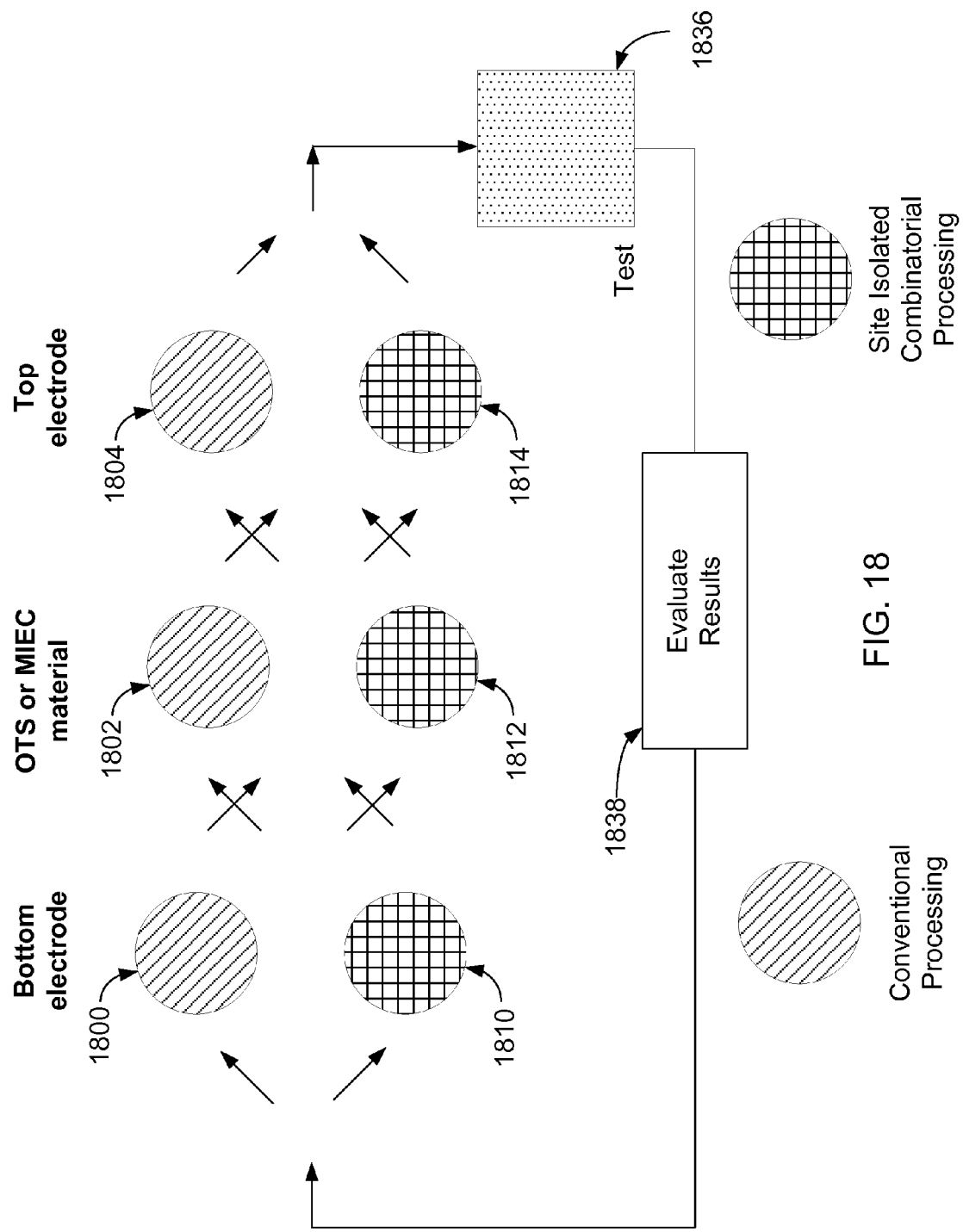
FIG. 18 illustrates a flow diagram for forming another test structure evaluation according to some embodiments.

FIG. 18 illustrates a flow diagram for forming another test structure evaluation according to some embodiments. Additional layers can be included in the test methodology, including the bottom and top electrode layers. Through the use of a combination of conventional and combinatorial processing systems (i.e. systems capable of processing multiple isolated regions on a single substrate) a number of trajectories through the various systems illustrated in the flow diagram of FIG. 18 can be envisioned. In FIG. 18, the bottom electrode layer may be deposited in a conventional processing manner, 1800, or in a site isolated combinatorial processing manner, 1810. The current selector layer may be processed in a conventional processing manner, 1802, or in a site isolated combinatorial processing manner, 1812. The top electrode layer may be deposited in a conventional processing manner, 1804, or in a site isolated combinatorial processing manner, 1814. After the deposition of the various layers and subsequent processing, the various MIM stacks represented by each of the site isolated regions may be testing in step 1836, and the results evaluated in step, 1838. As discussed previously, the results will form the basis for additional cycles of investigation through HPC techniques to identify materials and process conditions that evaluate the suitability of current selector devices with respect to different materials and processes.

Using the simple diagram in FIG. 18, there are eight possible trajectories through the process sequence. These eight trajectories encompass all of the possible combinations of conventional and combinatorial processing illustrated. Those skilled in the art will understand that HPC techniques may be applied to other processes not illustrated such as anneal treatments, etching, surface treatments, surface functionalization, etc. As more variable process steps are included, the total number of required experiments increases dramatically. This illustrates the benefits of using HPC techniques to limit the number of substrates to a manageable number and minimize the cost of the development program.

Figure 19:
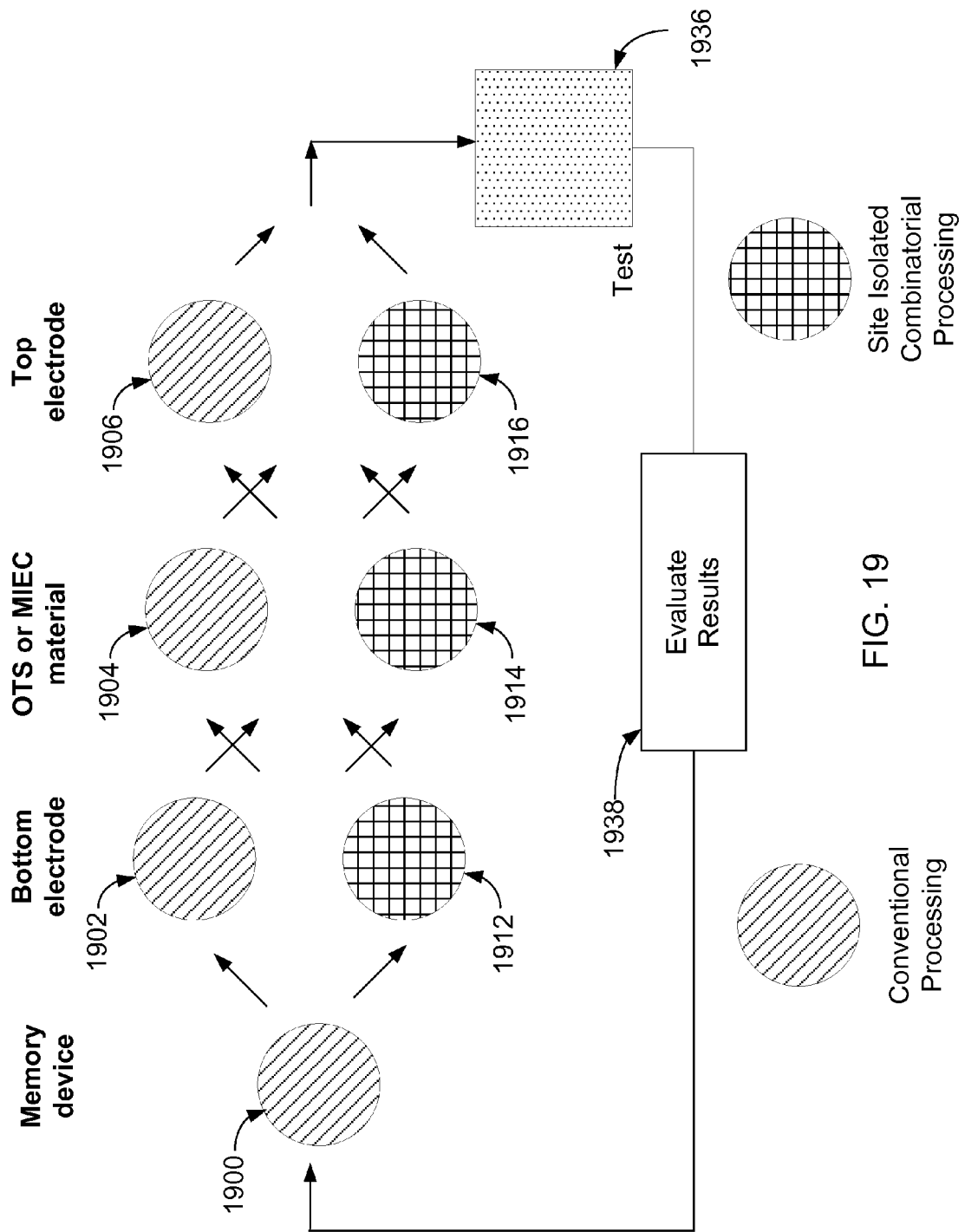
FIG. 19 illustrates a flow diagram for forming another exemplary test structure evaluation according to some embodiments.

FIG. 19 illustrates a flow diagram for forming another exemplary test structure evaluation according to some embodiments. Additional layers can be included in the test methodology, including the layers for the memory devices or array. Through the use of a combination of conventional and combinatorial processing systems (i.e. systems capable of processing multiple isolated regions on a single substrate) a number of trajectories through the various systems illustrated in the flow diagram of FIG. 19 can be envisioned. In FIG. 19, the memory device may be processed in a conventional processing manner, 1900, in some embodiments where the memory device is not a variable. The bottom electrode layer may be deposited in a conventional processing manner, 1902, or in a site isolated combinatorial processing manner, 1912. The current selector layer may be processed in a conventional processing manner, 1904, or in a site isolated combinatorial processing manner, 1914. The top electrode layer may be deposited in a conventional processing manner, 1906, or in a site isolated combinatorial processing manner, 1916. After the deposition of the various layers and subsequent processing, the various devices represented by each of the site isolated regions may be tested in step 1936, and the results evaluated in step, 1938. As discussed previously, the results will form the basis for additional cycles of investigation through HPC techniques to identify materials and process conditions that evaluate the suitability of current selector materials and processes with respect to cross point memory arrays.

Using the simple diagram in FIG. 19, there are eight possible trajectories through the process sequence. These eight trajectories encompass all of the possible combinations of conventional and combinatorial processing illustrated. Those skilled in the art will understand that HPC techniques may be applied to other processes not illustrated such as anneal treatments, etching, surface treatments, surface functionalization, etc. As more variable process steps are included, the total number of required experiments increases dramatically. This illustrates the benefits of using HPC techniques to limit the number of substrates to a manageable number and minimize the cost of the development program.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for development of cross point memory arrays, the method comprising:
   forming a first layer over a substrate,
      wherein the first layer comprises a chalcogenide material positioned in different site isolated regions of the substrate,
      wherein a process condition used for forming the first layer is varied in a combinatorial manner between the different site isolated regions,
      wherein the first layer is operable as an ovonic threshold switch; and
   forming a first electrode over the first layer.

2. A method as in claim 1 further comprising
   forming a second electrode over the substrate;
   forming a second layer over the second electrode,
      wherein the second layer comprises a chalcogenide material,
      wherein the second layer is operable as a phase change material;
   forming a third electrode over the second layer.

3. A method as in claim 1 further comprising
   forming a second electrode over the substrate;
   forming a second layer over the second electrode,
      wherein the second layer comprises a metal oxide material,
      wherein the second layer is operable as a switching layer;
   forming a third electrode over the second layer.

4. A method as in claim 1 wherein a material composition of the first layer is varied in a combinatorial manner.

5. A method as in claim 1 wherein the combinatorial processing comprises at least one of physical vapor deposition, co-evaporation, atomic layer deposition, or thermal processing.

6. A method for the development of cross point memory arrays, the method comprising:
   defining site isolated regions on a substrate;
   forming a first layer in each of the site isolated regions,
      wherein the first layer comprises a chalcogenide material,
      wherein the first layer is operable as an ovonic threshold switch,
      wherein a process condition of the first layer formation is varied in a combinatorial manner between the site isolated regions; and
   measuring a structural characteristic of the first layer within each site isolated region.

7. A method as in claim 6 further comprising forming a memory device in each site isolated region, wherein each memory device is operable as a phase change memory device or a resistive switching memory device.

8. A method as in claim 6 wherein a composition is varied in a combinatorial manner between the site isolated regions comprising varying a number of elements in the composition.

9. A method as in claim 6 wherein a composition is varied in a combinatorial manner between the site isolated regions comprising varying a ratio of the elements in the first layer.

10. A method as in claim 6 wherein varying the process condition in the combinatorial manner between the site isolated regions comprises varying a temperature of a heat treatment of the first layer.

11. A method as in claim 6 wherein varying the process condition in the combinatorial manner between the site isolated regions comprises varying an integration process of the first layer with the memory device.

12. A method as in claim 6 wherein measuring a structural characteristic comprises measuring a phase stability of the first layer material.

13. A method as in claim 6 wherein measuring an electrical characteristic comprises measuring at least an endurance, a variability, a reliability, or a performance of the memory device.

14. A method for the development of cross point memory arrays, the method comprising:
- defining a plurality of site isolated regions on a substrate;
- forming a first electrode in each site isolated region;
- forming a first layer over the first electrode in each of the site isolated regions,
  - wherein the first layer comprises a chalcogenide material,
  - wherein the first layer is operable as an ovonic threshold switch,
  - wherein a process condition of the first layer formation is varied in a combinatorial manner between the site isolated regions;
- forming a second electrode over the first layer,
- measuring an electrical characteristic of the first layer within each site isolated region.

15. A method as in claim 14 further comprising forming a memory device in each site isolated region, wherein the memory device is operable as a phase change memory device or a resistive switching memory device.

16. A method as in claim 14 wherein a composition is varied in a combinatorial manner between the site isolated regions comprising varying a number of elements in the first layer.

17. A method as in claim 14 wherein a composition is varied in a combinatorial manner between the site isolated regions comprising varying a ratio of elements in the first layer.

18. A method as in claim 14 wherein varying the process condition in the combinatorial manner between the site isolated regions comprises varying a temperature of a heat treatment of the first layer.

* * * * *